United States Patent [19]

Kimbrough

[11]  4,253,180

[45]  Feb. 24, 1981

[54] VOLTAGE CONTROLLED OSCILLATOR FOR A TRANSMISSION LINE COMMUNICATIONS SYSTEM RECEIVER

[75] Inventor: Mahlon D. Kimbrough, Hurst, Tex.

[73] Assignee: Reliance Telecommunication Electronics Company, Bedford, Tex.

[21] Appl. No.: 966,146

[22] Filed: Dec. 4, 1978

[51] Int. Cl.³ .......................... H04J 1/02; H03B 3/04
[52] U.S. Cl. ................................ 370/69; 331/177 R; 455/260
[58] Field of Search .......... 179/15 FD, 15 FS, 1 GB, 179/1 GD, 1 GE; 329/122, 123, 124, 125, 50; 325/419, 420; 331/177 R, 177 V, 36 R; 370/69; 455/260

[56] References Cited

U.S. PATENT DOCUMENTS

| | | | |
|---|---|---|---|
| 2,960,573 | 11/1960 | Hodgson et al. | 179/15 FS |
| 3,582,823 | 6/1971 | Pasos | 331/177 V |
| 3,603,890 | 9/1971 | Camenzind | 329/122 |
| 4,000,476 | 12/1976 | Walker et al. | 329/122 |
| 4,001,511 | 1/1977 | Buchholtzer et al. | 179/1 FS |

OTHER PUBLICATIONS

"On An Inductorless FM Stereo Multiplex Circuit using a Phase-Locked Loop," *IEEE Trans. Broadcast & Television Receivers*, USA, vol. BTR-16, No. 4 (Nov. 1970), by Padgett et al., pp. 281–289, 329–122.
"A Primer on Phase-Locked Loops," by Lew, *Electronic Design*, Jul. 20, 1964, pp. 56–60, vol. 12, No. 15.

*Primary Examiner*—Douglas W. Olms
*Attorney, Agent, or Firm*—William J. Clemens; Michael M. Rickin

[57]  ABSTRACT

A voltage controlled oscillator which may be used in the receiver of a communications system, such as a carrier telephone system, for aiding in the demodulation of received carrier signals. The oscillator includes circuitry for generating first and second reference signals at a frequency equal to the carrier signal. Also included in the oscillator is circuitry which in response to the magnitude of an error signal variably connects a frequency determining electrical parameter to the frequency generating circuitry to thereby vary the frequency of the reference signals. The error signal magnitude represents the difference in phase between the carrier signal and the first reference signal.

15 Claims, 12 Drawing Figures

VOLTAGE CONTROLLED OSCILLATOR FOR A TRANSMISSION LINE COMMUNICATIONS SYSTEM RECEIVER

CROSS REFERENCE TO RELATED APPLICATIONS

Of interest are the following copending applications which are all filed on even date herewith, all based on the invention of M. D. Kimbrough and all assigned to the same assignee as the present application:

(1) Ser. No. 966,000, entitled "A Failure Alarm for a Transmission Line Communications System".

(2) Ser. No. 966,100, entitled "Frogging Signal Repeater For a Transmission Line Communications Systems".

(3) Ser. No. 966,194 entitled "Sideband Cancellation Circuit for a Transmission Line Communication System".

BACKGROUND OF THE INVENTION

1. Field of the Invention

This invention relates in general to a receiver for demodulating the carrier signal in a telephone communications system and in particular to an oscillator for generating the reference signals used to demodulate the carrier signal.

2. Description of the Prior Art

The telephone system in the United States and throughout most of the world is controlled by a plurality of switching centers. A local switching center which is the lowest class switching center is typically referred to as an end central office and is directly connected to a selected number of telephones and other subscriber equipment. The end central offices are connected to toll switching centers which in turn are connected to higher class switching centers.

End central offices in the same area code can be connected together by means of interoffice trunk lines known as EAS (Extended Area Service) trunks. Calls made between subscribers connected to different central offices in the same area code can be routed either through an associated toll center or over an interoffice EAS trunk line if one is available. It is highly desirable to have the end central offices connected by means of trunk lines, as they reduce the overall switching load on the associated toll centers and provide a larger toll-free dialing area for subscribers.

Trunk lines typically utilize a carrier communication system wherein a plurality of communication channels are transmitted and received on a transmission cable at selected carrier frequencies. Each end central office includes suitable modems for modulating the transmit signals and for demodulating the received signals. An interface means is typically provided at each end central office for interfacing the respective modems to the transmission cable.

The characteristics of a typical transmission cable are such that the higher frequency carrier signals are attenuated at a greater rate than the lower frequency carrier signals. To compensate for this greater rate of attenuation, the modems generate the carrier signals at power levels determined by their respective frequencies. The higher frequency carriers are generated at a higher power level than the lower carrier frequencies. This technique of generating the carrier signals at power levels determined by their respective frequencies is typically referred to as presloping the carrier group.

When the carrier group signals are all at the same power level, the carrier group is referred to as being flat or having a level slope.

When the distance between central offices becomes relatively great, it becomes desirable to utilize standard repeaters along the transmission cable to maintain the signals above the noise level. In thise case, the central office preslopes the carrier group such that it arrives at the repeater flat. The repeater then amplifies and preslopes the carrier group before transmitting the group to the next repeater. The number of standard repeaters which can be used along a transmission cable is typically limited by the system specifications.

When the transmission cable connecting two central offices is a single pair of lines, the central offices must transmit a channel at one frequency while receiving that channel at another carrier frequency. In a trunk communication system of this type, a technique known as frequency frogging is often utilized at an intermediate repeater for interchanging the frequency allocations of the carrier channels. In this case, each central office transmits the channels at one group of carrier frequencies and receives the channels at a second group of carrier frequencies. A frogging repeater is connected between two central offices and functions to translate the first group of incoming carrier frequencies transmitted by each central office into the second group of outgoing carrier frequencies to be received by each central office. The frogging repeater can also preslope the carrier groups before transmitting the signals to the respective central offices.

One of the problems associated with present trunk communication systems relates to the locations of the repeaters along the transmission cable. The central offices and the standard repeaters typically introduce a predetermined slope in the outgoing carrier group such that the carrier group will be flat after a predetermined length of cable. Since the central office equipment and the standard repeaters are typically designed to receive a relatively flat carrier group, they must be connected together by a cable of the predetermined length. However, since the cable length between two central offices is seldom equal to the predetermined length of a multiple thereof, means must be provided to compensate for the intermediate length cable.

One device used to correct the carrier group slope when the transmission cable is not a multiple of the predetermined length is a frogging repeater manufactured by Anaconda Telecommunications, Anaheim, California. This frogging repeater includes means for connecting additional circuitry, known as line build-out cards, between the incoming carrier cable and the frogging repeater and between the frogging repeater and the outgoing carrier cable. This additional circuitry is selected to simulate the length of cable required to bring the effective cable length up to the predetermined length. Thus, after the incoming signals pass through this additional circuitry, the carrier group will be relatively flat. Similarly, the outgoing group passes through the required number of line build-out cards such that the group will be flat when received by either a standard repeater or a central office. However, a disadvantage of this system is that the frogging repeater must be separately designed for each application.

Another problem associated with present trunk communication systems relates to signaling associated with each communication channel. In addition to providing a path for voice communication, each channel typically provides a path for any signaling associated with that particular channel. The signaling allows the switching equipment at each end central office to communicate and includes such signals as on-hook, off-hook and dialing signals. However, the circuitry required for demodulating the carrier signal and for separating the signaling from the voice signal is typically relatively complex.

The voice communication and signalling information for each channel are recovered from the associated carrier in a receiver. A phase locked loop including a voltage controlled oscillator is contained in the receiver. The phase locked loop allows the receiver to lock onto the frequency of the received carrier signal. The oscillator generates reference signals which are at the same frequency as the carrier signal but in a predetermined phase relationship thereto.

The phase locked loop must not only lock onto the incoming carrier signal but also must maintain lock even if the incoming carrier signal shifts in phase relationship to the reference signal. The time rate of change of phase is frequency. Thus, the oscillator must contain some means which allows its output frequency to vary as a function of the phase difference between the carrier and reference signals.

In receivers which demodulate FM signals, variability in oscillator frequency is achieved by using zener diodes. A reverse biased zener diode has a linear capacitance versus voltage chracteristic. Typically, the capacitance varies from 50 to 100 picofarads over the range of reverse bias voltages. This variation in capacitance is sufficient at the carrier frequencies associated with FM signals to provide variability of oscillator output frequency over a predetermined range. The variation is, however, insufficient at the carrier frequencies typically associated with AM trunk carrier signals to provide the needed range of oscillator output frequency.

At trunk carrier frequencies the typical voltage controlled oscillator utilizes RC circuit elements in order to achieve frequency variation. The frequency variation is achieved by varying the charge current into the capacitor. When the oscillator is used in a receiver which may be subject to a wide variation in temperature for example, 30° F. to 120° F. ($-1°$ C. to 49° C.), oscillators using LC circuit elements will have to be used in place of RC oscillators. LC oscillators have substantially less drift with temperature as compared to RC oscillators and are thus inherently more stable. It is therefore desirable to use LC voltage controlled oscillators at trunk carrier frequencies. It is further desirable to use LC oscillators which allow their output frequency to be simply and easily varied over a desired range in response to differences in phase between the incoming carrier signal and the oscillator output frequency.

A further problem associated with present trunk communication systems relates to the interface means connected between the central office and the transmission cable. The interface means typically includes a carrier group alarm for indicating a system failure. However, most alarm systems typically must be restored manually. Although some alarm systems include a means for automatically restoring the system after recovery, the additional circuitry required is relatively expensive.

SUMMARY OF THE INVENTION

The present invention concerns a receiver for demodulating information signals from a carrier signal in a communications system such as a telephone system. A voltage controlled oscillator is responsive to an error signal for generating first and second reference signals at the carrier signal frequency. The first reference signal is minus ninety degrees out of phase with the carrier signal. A quadrature detector generates a demodulated output signal which is the product of the carrier signal and the first reference signal. A loop filter generates the error signal with a magnitude representing the phase difference between the carrier signal and the output signal.

The second reference signal is one hundred eighty degrees out of phase with the carrier signal. A synchronous detector generates the demodulated information signals as the product of the carrier signal and the second reference signal.

The voltage controlled oscillator includes an inductor-capacitor (L-C) oscillator, a capacitor and a switch responsive to the magnitude of the error signal for connecting the capacitor to the L-C oscillator. Thus, the frequency at which the reference signals are generated is related to the portion of each cycle of the reference signals during which the capacitor is connected to the L-C oscillator. The portion of each cycle during which the capacitor is connected is related to the magnitude of the error voltage.

It is an object of the present invention to more accurately demodulate information signals from carrier signals in a communications system.

DESCRIPTION OF THE PREFERRED EMBODIMENT

Figure 1:
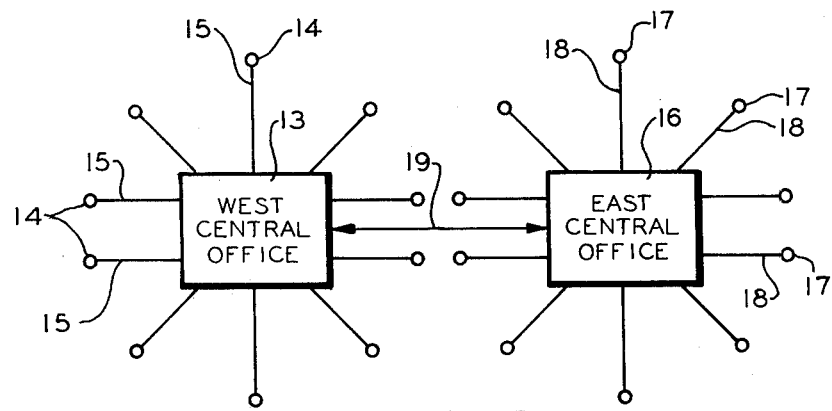
FIG. 1 is a block diagram of a local telephone switching network to which the present invention is applicable.

There is shown in FIG. 1 a block diagram of a typical local telephone switching network to which the present invention is applicable. A west central office 13 is connected to a plurality of subscriber telephone sets 14 by a plurality of subscriber lines 15. Similarly, an east central office 16 is connected to a plurality of subscriber telephone sets 17 by a plurality of subscriber lines 18.

The central offices 13 and 16 are connected by means of a trunk line 19. As will be discussed, the trunk line 19 includes repeaters located at selected points along the line 19 for conditioning the transmitted signals.

Each of the central offices 13 and 16 contains equipment for handling outgoing calls from subscribers and for completing incoming calls to its subscribers. Calls made between subscribers connected to the same central office are handled entirely by that central office. A call from one of the telephone sets 14 to one of the telephone sets 17 is routed along the trunk line 19. Although only one trunk line is shown in FIG. 1, the central offices 13 and 16 can be connected by a plurality of trunk lines. Also, each of the central offices can be connected to other central offices (not shown) by trunk lines similar to the trunk line 19.

The trunk line 19 is typically a single cable pair which provides a transmission path for a plurality of communication channels. As will be discussed, each central office includes means for transmitting and receiving the various communication channels at a plurality of selected carrier frequencies.

Figure 2:
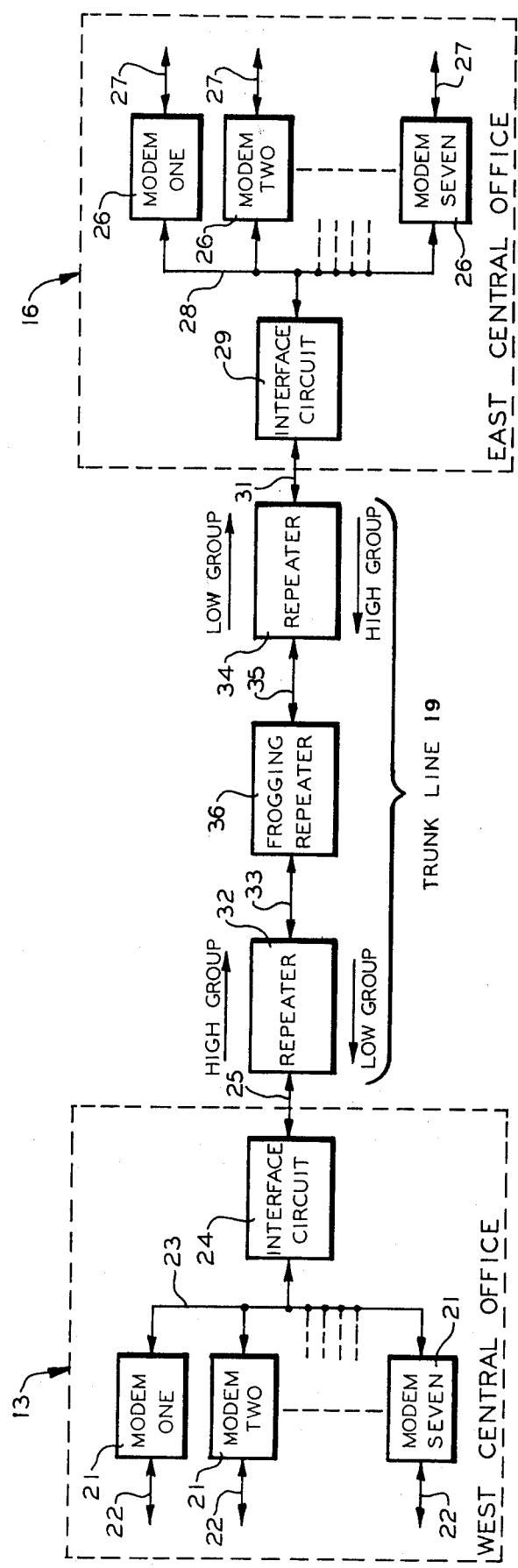
FIG. 2 is a block diagram of the trunk communication system of FIG. 1 according to the present invention.

There is shown in FIG. 2 a block diagram illustrating the trunk communication system of FIG. 1 according to the present invention. The west central office 13 includes a plurality of modems 21 each of which transmits and receives a message at voice frequency on a plurality of office lines 22 connected to a plurality of switching circuits (not shown). Each modem 21 transmits a modulated transmit signal on a plurality of interface lines 23 and receives a modulated receive signal on the interface lines 23. Each modem 21 modulates the transmit signal at one frequency of a group of relatively high frequency carrier signals and receives the associated modulated receive signal at one frequency of a group of relatively low frequency carrier signals. As will be discussed, a frogging repeater 36 is included in the trunk line 19 for translating the high and low frequency groups.

An interface circuit 24 is utilized to convert the various transmit and receive signals on a single cable pair line 25 into separate transmit and receive lines included in the interface lines 23. As will be discussed, the interface circuit 24 includes means for generating an alarm signal to the modems 21 when the power level of the modulated receive signals on the interface lines 23 falls below a predetermined level. The interface circuit 24 also transmits power to the various trunk line repeaters and generates a system reference signal to the modems 21 on one of the lines 23. The modems utilize the reference signal to generate the particular carrier frequencies required for modulation of the transmit signals.

The east central office 16 includes equipment similar to that found in the west central office 13. Modems 26, lines 27, lines 28, interface circuit 29 and a single cable pair line 31 are all similar to the corresponding elements in the west central office.

The distance between central offices determines the length of the trunk line. The length of the trunk line is typically designated in terms of the power loss which occurs in a signal at a selected frequency when it is transmitted along the trunk line. For example, a trunk line which results in a power loss of 30 decibels (dB) in the transmission of a selected frequency signal is referred to as having a length of 30 dB.

The characteristics of transmission lines are such that the higher frequency signals are attenuated at a greater rate than the lower frequency signals. To compensate for this difference in attenuation, the signals transmitted by the central offices on the trunk line are presloped to ensure that all the signals are flat, i.e., at the same power level, when they are received for demodulation. Thus, the signals transmitted by the modems 21 are presloped such that they will be flat when received by a standard repeater 32. This is accomplished by generating each signal at a higher magnitude than the next lower frequency signal. As will be discussed the frogging repeater 36 transmits a group of low frequency signals in each direction which are presloped such that they arrive at the respective standard repeater flat.

In order to maintain the power level of each carrier signal above the noise level, the trunk line 19 includes standard repeaters located at selected points along the line. The trunk line 19 includes the standard repeater 32 connected between a single cable pair line 33 and the line 25. A standard repeater 34 is connected between the line 31 and a single cable pair line 35. The line 25 is of a predetermined length and the modems 21 are designed such that the high frequency group signals are transmitted at a predetermined slope so that they will be flat when received by the repeater 32. The repeater 32 receives the low frequency group signals on the line 33 and introduces a predetermined slope in these signals such that they will be flat when received by the modems 21. The modems 26 and the repeater 34 operate in a similar manner.

A frogging repeater 36 is connected between the lines 33 and 35 and functions to translate the incoming high frequency group signals on the lines 33 and 35 to the low frequency group signals on the lines 35 and 33 respectively. This process of interchanging the frequency allocations of carrier channels is known as frequency frogging. Frequency frogging reduces crosstalk between two carrier systems utilizing the same transmission cable. In addition to frequency frogging the incoming high frequency group signals, the frogging repeater 36 also functions to preslope the outgoing low frequency group signals on the lines 33 and 35 such that they will be flat when they are received by the respective standard repeaters. As will be discussed, in the frogging repeater included in the trunk communication system of the present invention, the slope of the outgoing low group signals to a central office is controlled by the power level of the incoming high group signals transmitted by that central office. Thus, the lines 33 and 35 do not have to be of a predetermined length as is required of the lengths of the lines 25 and 31.

Although FIG. 2 shows one standard repeater located on each side of the frogging repeater 36, more or less standard repeaters can be used. The number of standard repeaters used depends on the length of the trunk line connecting the west and east central offices. Where the line length is relatively short, no standard repeaters need be used. However, the predetermined line lengths must be maintained between the central offices and the standard repeaters and between adjacent standard repeaters. Only the line lengths on each side of the frogging repeater can be less than the predetermined line length.

Figure 3:
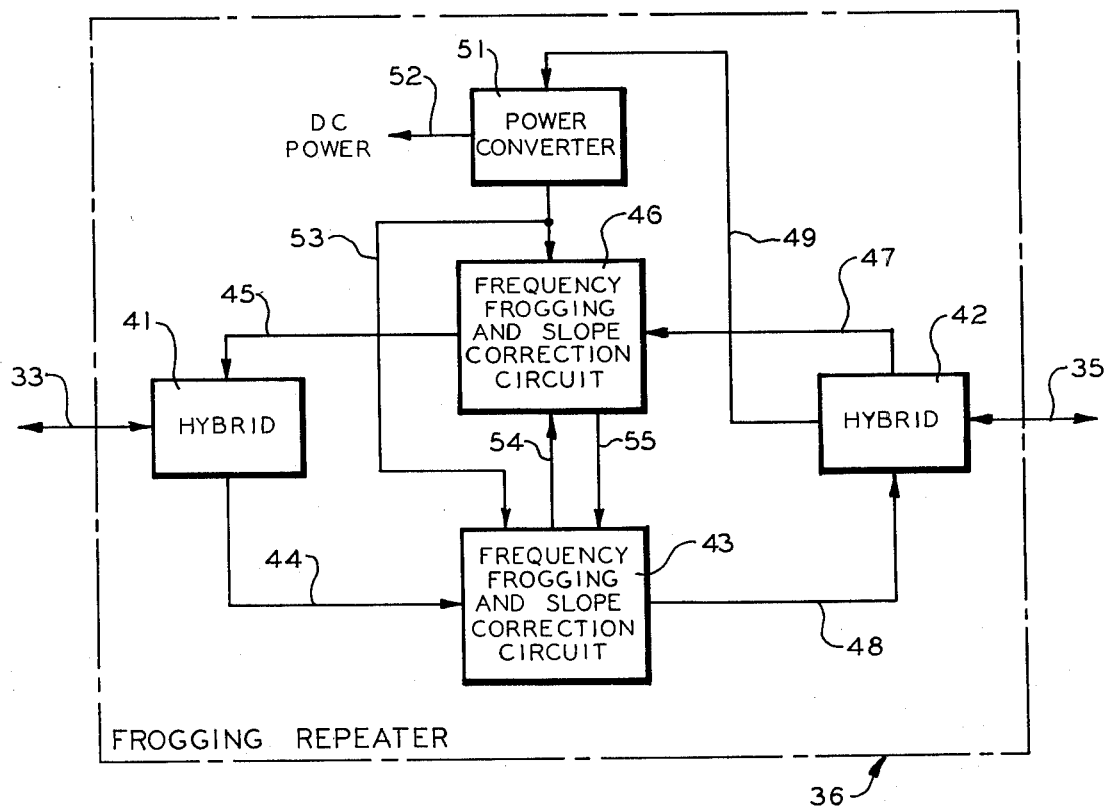
FIG. 3 is a block diagram of the frogging repeater shown in FIG. 2.

There is shown in FIG. 3 a block diagram of the frogging repeater 36 according to the present invention. The repeater 36 includes a pair of hybrid circuits 41 and 42 connected to the single cable pair lines 33 and 35 respectively. The incoming high frequency group of signals on the line 33 is received by the hybrid 41 and transmitted to a frequency frogging and slope correction circuit 43 on a line 44. The hybrid 41 also receives a low frequency group of signals on a line 45 from a frequency frogging and slope correction circuit 46 and transmits these signals on the line 33. The hybrid 41 typically comprises a combination of transformers which permit the signals on the line 45 to be transmitted to the line 33 and the signals on the line 33 to be received by the line 44 but effectively isolates the signals on the lines 44 and 45 from each other.

The hybrid 42 functions in a manner similar to the hybrid 41, transmitting the high frequency group of signals on the line 35 to the circuit 46 on a line 47 while receiving the low frequency group of signals on a line 48 from the circuit 43 and transmitting them to the line 35. The hybrid 42 also transmits a power signal on a line 49 to a power converter 51 which in turn generates a plurality of DC power signals on lines 52. The DC power signals on the lines 52 provide power to the various active components in the circuits 43 and 46. The converter 51 also generates a frequency reference signal on a line 53 to the circuits 43 and 46. As will be discussed, the circuit 43 mixes the high frequency group of signals on the line 44 with the reference signal on the line 53 to generate a low frequency group of signals on the line 48. The circuit 46 utilizes the reference frequency to transform the high group signals on the line 47 to the low group signals on the line 45.

Since the frogging repeater 36 is not always located a standard distance from a standard repeater or the central offices if the trunk line is not sufficiently long to require the use of any standard repeaters, the slope of the signals received at each end of the repeater 36 will vary in accordance with the length of the lines 33 and 35. In addition to transforming the high group signals into the low group of signals, the circuits 43 and 46 also function to flatten the respective incoming signals and to preslope the respective outgoing signals in accordance with the lengths of the lines 33 and 35.

The circuits 43 and 46 generate coordination reference signals on lines 54 and 55 respectively representing the strength of the high group of signals on the lines 44 and 47 respectively. Thus, since the signals on the lines 44 and 47 were originally transmitted at predetermined power levels, the coordination reference signals on the lines 54 and 55 are representative of the length of the lines 33 and 35 respectively. The low group signals generated on the line 48 by the circuit 43 are presloped in accordance with the magnitude of the coordination reference signal on the line 55 such that they will arrive at the standard repeaters 34 relatively flat. Similarly, the low group signals generated on the line 45 by the circuit 46 are presloped in accordance with the magnitude of the signal on the line 54.

Figure 4:
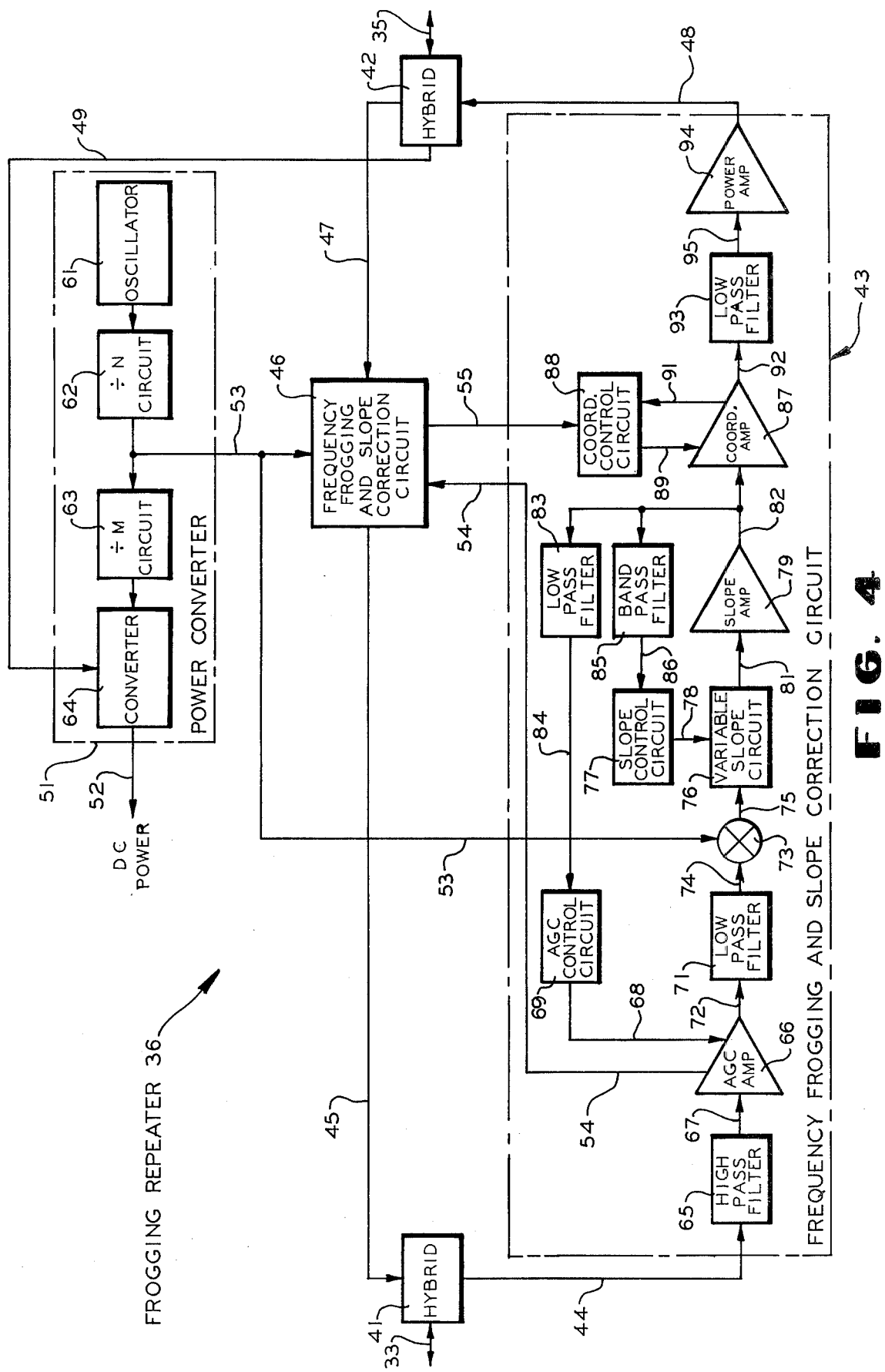
FIG. 4 is a more detailed block diagram of the frogging repeater of FIG. 3.

FIG. 4 is a more detailed block diagram of the frogging repeater 36 of FIG. 3. To simplify the description, only the detail for the circuit 43 will be discussed, as the circuits 43 and 46 are identical.

The power converter 51 includes a crystal controlled oscillator 61 for generating a pulse train at the crystal frequency to a divide-by-N ($\div N$) circuit 62. The circuit 62 generates a pulse on the line 53 for every N pulses received from the oscillator 61. The value N is selected such that the frequency reference signal on the line 53 is at the frequency required for the high to low frequency translation by the circuits 43 and 46.

The signal on the line 53 is also supplied to a $\div M$ circuit 63 which generates a pulse to a converter 64 for every M pulses on the line 53. The converter 64 utilizes the pulse train from the circuit 63 and the power signal on the line 49 to generate a plurality of regulated DC voltages on the lines 52. Although the converter 64 receives the power signal on the line 49 from the hybrid 42, the power signal can also be obtained from the hybrid 41.

The circuit 43 includes a high pass filter 65 which functions to pass the high frequency group of signals on the line 44 to an automatic gain control (AGC) amplifier 66 on a line 67. The filter 65 attenuates the lower frequency signals. The cutoff frequency of the filter 65 is typically chosen slightly below the lower sideband of the lowest carrier signal of the high frequency group signals.

The AGC amplifier 66 receives a control signal on a line 68 from an AGC control circuit 69 for controlling the gain of the amplifier 66. The output of the AGC amplifier 66 is supplied to a low pass filter 71 on a line 72. The amplifier 66 also generates a coordination reference signal on the line 54 which is representative of the length of the line 33.

The filter 71 typically has a cutoff frequency slightly above the highest frequency of the high group signals such that harmonics, noise and AM radio signals are sufficiently attenuated. The output of the filter 71 is supplied to one input of a mixer 73 on a line 74. The other input of the mixer 73 is connected to the line 53 to receive the frequency reference signal from the converter 51. The mixer 73 generates output signals on a line 75 as low group signals at frequencies which represent the difference between the frequency reference signal and the frequencies of the high group signals on the line 74. The highest frequency carrier signal on the line 74 becomes the lowest frequency carrier signal on the line 75 while the lowest frequency signal on the line 74 becomes the highest frequency signal on the line 75.

The low frequency group of signals on the line 75 is supplied to a variable slope circuit 76 which in turn slopes the signals in accordance with a slope control signal received from a slope control circuit 77 on a line 78. The circuit 76 supplies its output signal to a slope amplifier 79 on a line 81. The slope amplifier 79 functions in conjunction with the slope circuit 76 and the AGC amplifier 66 to generate the low group signals on a line 82 at a preselected magnitude.

The flattening of the low group signals is essentially a two step method. The signals on the line 82 are supplied to a low pass filter 83 which permits the lowest frequency carrier to be supplied to the AGC control circuit 69 on a line 84. The gain of the AGC amplifier 66 is controlled by the signal on the line 68 such that the level of the lowest frequency carrier on the line 82 is maintained at a fixed level.

The signals on the line 82 are also supplied to a band pass filter 85 which affords a path for the highest frequency carrier to the slope control circuit 77 on a line 86. The circuit 77 is responsive to the slope introduced by the slope amplifier 79 to control the variable slope circuit 76 such that the signal on the line 81 is generated at a slope which is generally the negative of slope introduced by the slope amplifier 79. Thus, the amplifier 79 essentially cancels the slope of the signals on the line 81 and the signals on the line 82 will be generally flat.

The signals on the line 82 are supplied to a coordination amplifier 87 which amplifies and slopes the signals in accordance with a coordination drive signal received from a coordination control circuit 88 on a line 89. The control circuit 88 receives a coordination reference signal on the line 55 from an AGC amplifier (not shown) included in the circuit 46 which functions in a manner similar to the AGC amplifier 66. The signal on the line 55 represents the desired gain of the amplifier 66 and is generated at a magnitude determined by the power level of the incoming high group signals on the line 47. The circuit 88 receives a DC sense signal on a line 91 from the amplifier 87. The DC sense signal represents the actual gain of the amplifier 66. The circuit 88 compares the signals on the lines 55 and 91 to generate the coordination drive signal on the line 89. If the length of the line 35 is relatively short, the signals on the line 47 are received near the magnitude at which they were transmitted. Thus, if the signals on the line 48 are to be received by the standard repeater at the magnitude representing the flat condition, the amplifier 87 must generate output signals on a line 92 slightly above the predetermined magnitude representing the flat condition.

The signals on the line 92 are supplied to a low pass filter 93 which attenuates the higher frequency signals. The low group signals are then supplied to a power amplifier 94 on a line 95. The amplifier 94 amplifies the signals to the desired power level for transmission and the signals are generated on the line 48 to the hybrid 42.

Figure 5:
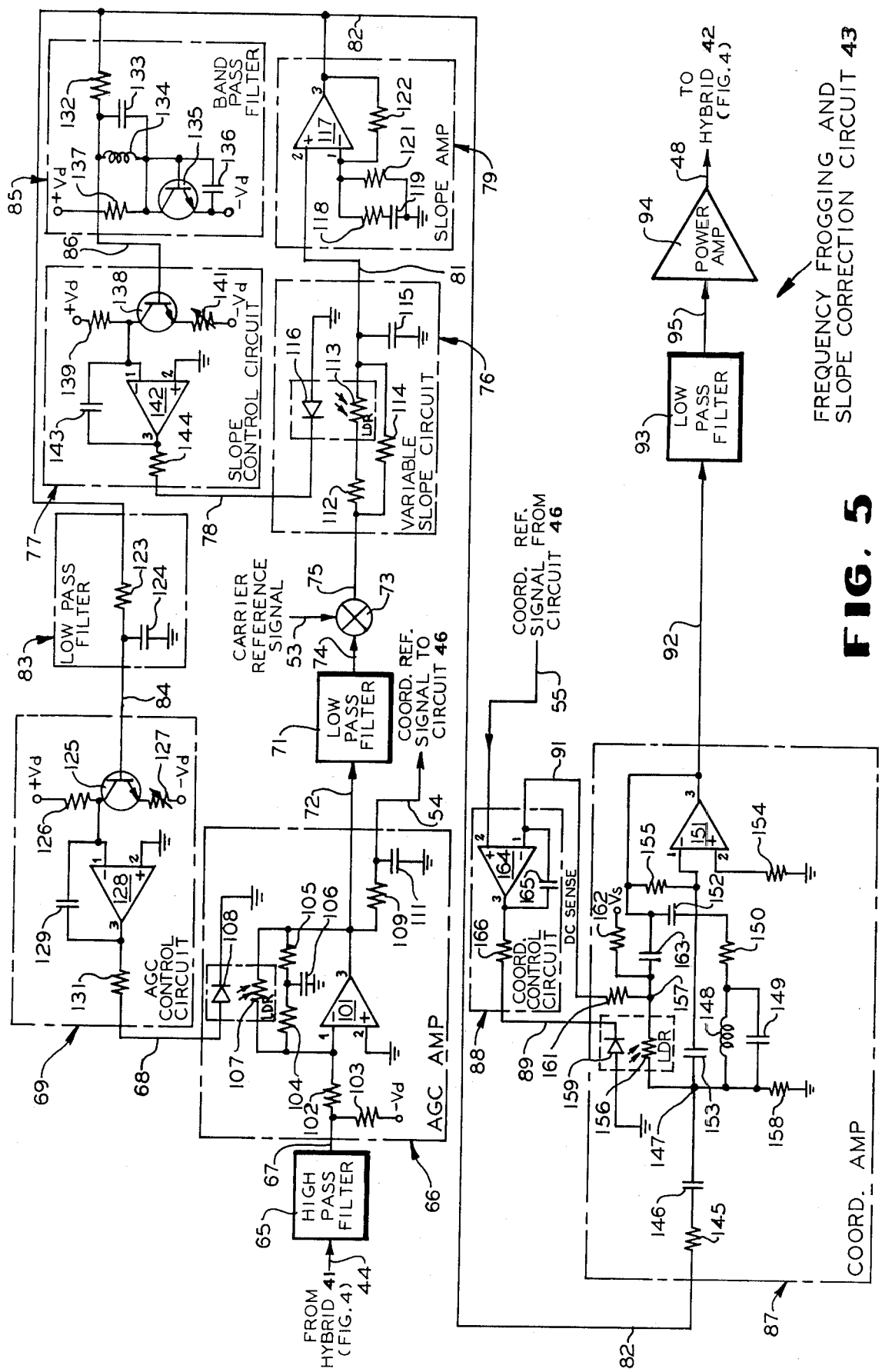
FIG. 5 is a partial block diagram, partial schematic of the frequency frogging and slope correction circuit shown in FIG. 4.

There is shown in FIG. 5 a partial schematic, partial block diagram of a portion of the frequency frogging and slope correction circuit 43 of FIG. 4. The AGC amplifier 66 includes a differential amplifier 101 having an inverting input 101-1 connected to the line 67 through a resistor 102. A resistor 103 is connected between a −Vd power supply (not shown) and the line 67.

A non-inverting input 101-2 is connected to the circuit ground potential while a pair of resistors 104 and 105 are connected in series between the input 101-1 and an output 101-3. A capacitor 106 has one terminal connected between the resistors 104 and 105 and the other terminal connected to the circuit ground. A light dependent resistor (LDR) 107 functions as a feedback resistor and is connected between the input 101-1 and the output 101-3. The LDR 107 is responsive to the light emitted by a light emitting diode (LED) 108 having an anode connected to the line 68 and a cathode connected to the circuit ground. The amplifier output 101-3 is connected to the line 72 and to the line 54 through a resistor 109. A filter capacitor 111 is connected between the line 54 and the circuit ground.

The amplifier 101 functions to amplify the high group signals on the line 67 with a gain factor which is determined by the resistance of the LDR 107 which is controlled by the light emitted from the LED 108. For example, as the AGC control circuit 69 increases the magnitude of the control signal on the line 68, the light output of the LED 108 increases and this in turn reduces the resistance of the LDR 107. Since the LDR 107 functions as a feedback resistor, the gain of the amplifier 101 will be reduced. The AGC control circuit 69 is responsive to the magnitude of the lowest frequency in the group generated on the line 82 such that the AGC amplifier 66 functions as a variable gain, unity gain compensated amplifier.

The resistor 103 introduces a DC current offset to the input 101-1 through the resistor 102 so that the output 101-3 has a DC offset from the circuit ground that is proportional to the gain of the amplifier. The network, including the resistors 104 and 105 and the capacitor 106, is a DC feedback circuit which causes the DC offset voltage at the output 101-3 to be a nonlinear function of the gain of the amplifier. As will be discussed, this output DC offset can be set to compensate for an intermediate line length.

The resistor 109 and the capacitor 111 filter the output of the amplifier 101 to obtain a DC voltage which appears on the line 54 as the coordination reference signal to the circuit 46. The magnitude of this signal is representative of the length of the line 44 and is supplied to a coordination control circuit (not shown) in the circuit 46.

As previously mentioned, the high group signals on the line 72 are filtered by the filter 71 and combined with a carrier reference signal by the mixer 73 to generate the low group signals on the line 75. The variable slope circuit 76 includes a resistor 112 and an LDR 113 connected in series between the line 75 and the line 81. A resistor 114 is connected between the lines 75 and 81 while a capacitor 115 is connected between the line 81 and the circuit ground. The LDR 113 is responsive to light emitted by an LED 116 having a cathode connected to the line 78 and an anode connected to the circuit ground.

The slope amplifier 79 includes a differential amplifier 117 having a non-inverting input 117-2 connected to the line 81 and an output 117-3 connected to the line 82. A resistor 118 is connected in series with a capacitor 119 between an inverting input 117-1 and the circuit ground. A resistor 121 is connected between the input 117-1 and the circuit ground while another resistor 122 is connected between the input 117-1 and the output 117-3.

The variable slope circuit 76 is essentially a first order low pass filter having a pole frequency which varies with the resistance of LDR 113. The slope amplifier 79 is essentially a high pass amplifier having a zero determined by the values of the capacitor 119 and the resistors 118 and 121.

The low pass filter 83 includes a resistor 123 connected between the lines 82 and 84 and a capacitor 124 connected between the line 84 and the circuit ground. The resistor 123 and the capacitor 124 are selected with a pole frequency which permits the lowest frequency carrier signal to pass through to the line 84, while sufficiently attenuating the remaining carrier signals.

The AGC control circuit 69 includes an NPN transistor 125 having a collector connected to a +Vd power supply (not shown) through a resistor 126, a base connected to the line 84 and an emitter connected to the −Vd power supply (not shown) through variable resistor 127. An amplifier 128 has an inverting input 128-1 connected to the collector of the transistor 125 and a noninverting input 128-2 connected to the circuit ground. A capacitor 129 is connected between the input 128-1 and an output 128-3 while a resistor 131 is connected between the output 128-3 and the line 68.

The transistor 125 functions as a biased detector and produces a negative polarity signal at the collector with a magnitude which represents the power level of the lowest frequency carrier signal on the line 82. This signal is filtered by the capacitor 129 and the amplifier 128 to produce a positive polarity signal at the output 128-3 which is supplied to the LED 108 through the current limiting resistor 131. As previously mentioned, the circuit 69 controls the gain of the AGC amplifier 66 to maintain the power level of the lowest frequency carrier at a fixed level. This level can be adjusted using the variable resistor 127.

If the level of the lowest frequency carrier on the line 82 begins to drop, the negative polarity signal at the input 128-1 is reduced and this in turn lowers the positive polarity signal at the output 128-3. The light emitted by the LED 108 is reduced to increase the resistance of LDR 107. This increases the gain of the AGC amplifier 66 and maintains the power level of the lowest frequency carrier on the line 82 at the desired level.

The band pass filter 85 includes a resistor 132 connected between the lines 82 and 86. A capacitor 133 and an inductor 134 are connected in parallel between the line 86 and the base of an NPN transistor 135. A capacitor 136 is connected between the base and emitter of the transistor 135. The transistor has its emitter connected to the −Vd power supply (not shown) while its base and collector are both connected to the +Vd power supply (not shown) through a resistor 137. The values of the resistor 132, the capacitor 133 and the inductor 134 are selected to provide a band pass filter having corner cutoff frequencies which permit the highest frequency carrier to pass through to the line 86, while sufficiently attenuating the remaining carrier signals.

The slope control circuit 77 includes an NPN transistor 138 having a collector connected to the +Vd power supply (not shown) through a resistor 139, a base connected to the line 86, and an emitter connected to the −Vd power supply (not shown) through a variable resistor 141. An amplifier 142 has an inverting input 142-1 connected to the collector of the transistor 138 and a non-inverting input 142-2 connected to the circuit ground. A capacitor 143 is connected between the input 142-1 and an output 142-3 while a resistor 144 is connected between the output 142-3 and the line 78.

The slope control circuit 77 operates in a manner similar to the AGC control circuit 69 and functions to vary the pole frequency of the slope circuit 76 to maintain the power level of the highest frequency carrier of the low group signals at a fixed level. The transistor 138 functions as a biased detector and generates a negative polarity signal at the input 142-1 having a magnitude which increases with the power level of the highest frequency carrier on the line 82. The amplifier 142 and the capacitor 143 filter the signal at the input 142-1 and generate a negative polarity signal at the output 142-3 to drive the LED 116 and set the resistance of the LDR 113 at the desired level. If the power level of the highest frequency low group carrier on the line 82 is too large, the signal at the output 142-3 will move less negative and decrease the current through the LED 116. This increases the resistance of LDR 113 to lower the pole frequency of the circuit 76 and decrease the power level of the signals on the line 82. The variable resistor 141 is utilized to select the desired power level of the highest frequency signal on the line 82. This level is typically selected to equal the power level of the lowest frequency carrier signal which is selected via the variable resistor 127.

Figure 6:
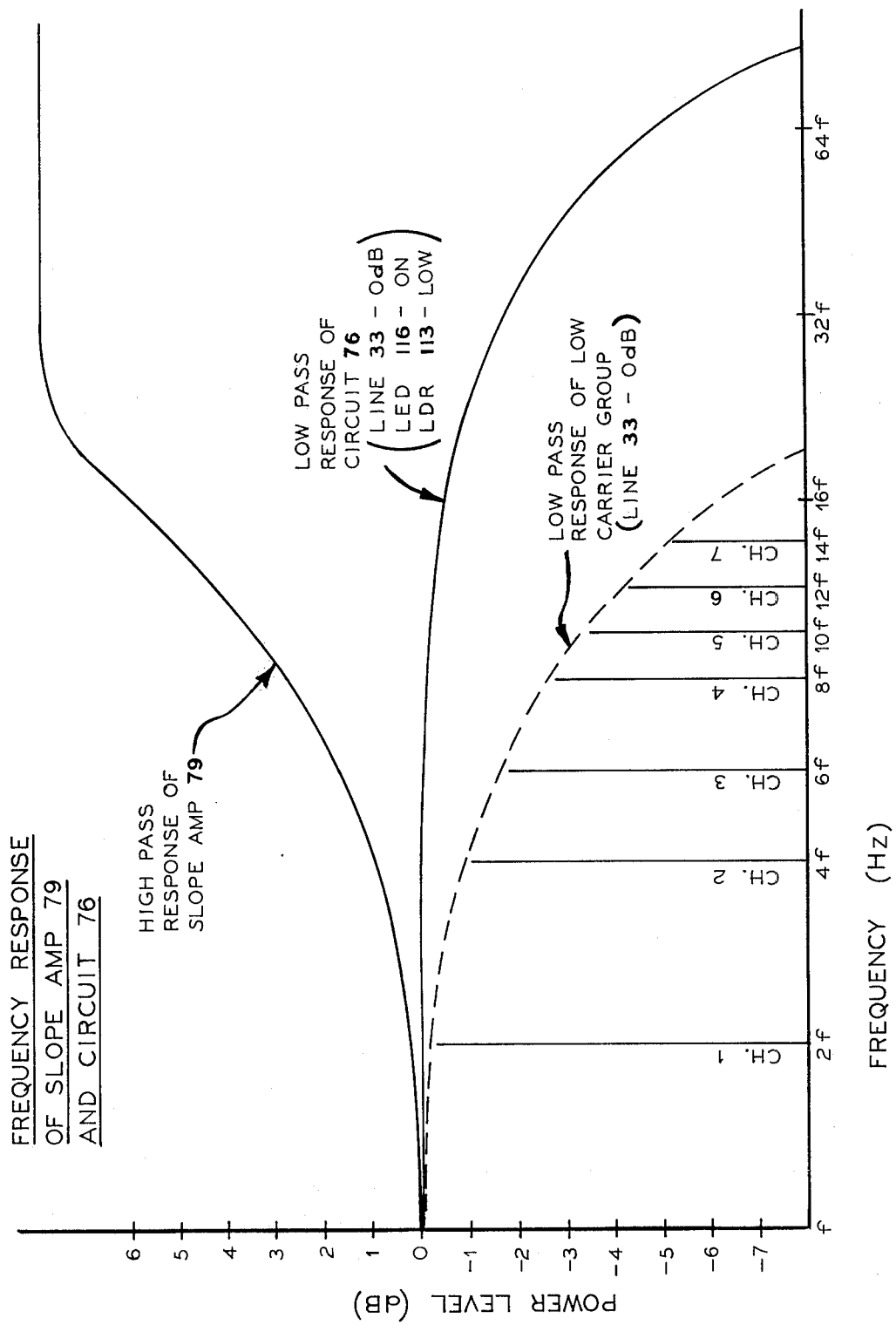
FIG. 6 is a frequency response graph for the slope amplifier and variable slope circuits of FIG. 5.

There is shown in FIG. 6 a frequency response graph which will be utilized to explain the operation of the slope amplifier 79 and the variable slope circuit 76. In FIG. 6, the low group carrier signals have been assigned specific frequencies, each separated by 2f Hz with channel one being located at 2f Hz and channel seven being located at 14f Hz.

As was previously mentioned, the standard repeater 32 preslopes the high group signals before transmitting them to the frogging repeater on the line 33. Since the line 33 can be of any length up to the predetermined length for a standard repeater, the magnitude of each signal in the group will be different unless the line is at the predetermined length. These signals must be flattened before they are presloped for transmission to a standard repeater or a central office. In order to simplify the circuitry required for flattening the signals, the high group signals are transformed into the low group signals before the flattening operation is performed. The circuitry required for flattening the low group signals can be further simplified by selecting appropriate low and high group carrier frequencies. These carrier frequencies must be chosen in conjunction with the cable length required between adjacent standard repeaters.

In FIG. 5 the circuitry required for flattening the low group signals comprises the variable slope circuit 76 and the slope amplifier 79. Both the circuit 76 and the amplifier 79 are relatively simple first order networks. The circuitry shown in FIG. 5 is utilized with a trunk communication system having depending on trunk line length zero or more standard repeaters and central offices which preslope each signal in the high group carrier signals by a predetermined amount. After the incoming high group is transformed to the low group in the frogging repeater, the power level of each sloped signal is representative of a first order low pass response. Thus, a first order circuit can be utilized to remove the slope. The low pass response occurs only at short cable lengths. As the incoming cable length increases, the magnitude of the signals decrease, the rate of decrease of the higher frequency signals of the high group being greater, and, near the predetermined maximum cable length, the signals are nearly flat with little or no slope correction necessary.

In FIG. 6, the high group carrier signals are received on the line 33 which is at its minimum length, for example, zero dB. The high group signals are received near the predetermined positive slope and are then transformed into the low group signals. The low group signals have a slope which is representative of a first order low pass response. In this case, the low group signals can be flattened by passing the signals through a first order high pass network having a zero frequency approximately equal to the pole frequency of the low pass carrier response. The low pass response of the circuit 76 must be adjusted to provide approximately zero dB of gain throughout the frequency band occupied by the low group signals. Thus, the amplifier 142 in the slope control circuit 77 generates a signal at the output 142-3 near the −Vd potential such that the LED 116 will be on and the resistance of the LDR 113 is low. This increases the pole of the circuit 76 so that the circuit 76 will not introduce any significant slope into the low group signals on the line 76.

When the incoming low group signals on the line 75 are relatively flat, no slope correction is necessary and the circuit 77 generates a negative polarity signal on the line 78 such that the LED 116 is on and the LDR 113 is at a resistance, such that the pole frequency of the circuit 76 equals the zero frequency of the slope amplifier 79. Thus, the slope introduced by the circuit 76 will be cancelled by the slope amplifier 79.

When the incoming cable is at an intermediate length, the resistance of the LDR 113 is adjusted such that the signals on the line 81 are generated at a slope approximately equal to the negative of the slope introduced by the slope amplifier 79. Hence, the combination of the slope of the incoming signals and the slope introduced by the circuit 76 is such as to be cancelled by the slope amplifier 79 and the low group signals will be generated on the line 82 relatively flat.

The coordination amplifier 87 (FIG. 5) includes a resistor 145 and a capacitor 146 connected in series between the line 82 and a common junction 147. An inductor 148 and a capacitor 149 are connected in parallel between the junction 147 and one terminal of a resistor 150 having the other terminal connected to an output 151-3 of an amplifier 151 through a capacitor 152. A capacitor 153 is connected between the junction 147 and the inverting input 151-1. A non-inverting input 151-2 is connected to the ground potential through a resistor 154. A resistor 155 is connected between the input 151-1 and an output 151-3 which is connected to the line 92.

An LDR 156 is connected between a common junction 157 and the junction 147 which is connected to the circuit ground through a resistor 158. The LDR 156 is responsive to light emitted by an LED 159 having an anode connected to the circuit ground and a cathode connected to the line 89. The junction 157 is connected to the line 91 through a resistor 161 and to a +Vs power supply (not shown) through a resistor 162. A capacitor 163 is connected between the junction 157 and the output 151-3.

The group of low frequency signals received by the coordination amplifier 87 on the line 82 are all generally at the same power level. As previously mentioned, the coordination amplifier 87 functions to preslope the low group signals such that the slope of the signals will be generally flat and at a predetermined power level when they are received by the standard repeater connected to the line 35. The LCR network comprising the inductor 148, the capacitor 149, and the resistor 150 in conjunction with the amplifier 151 and the LDR 156 functions to vary the slope and amplitude of the low group signals on the line 92.

Typically, the LCR network is selected to generate the slope desired when the outgoing cable length is at its maximum value. As the length of the outgoing cable decreases, the slope and amplification introduced by the co-ordination amplifier 87 must also be reduced. This is accomplished by varying the resistance of the LDR 156, which essentially shunts the LCR network in the feedback of the amplifier 151. When the outgoing cable length is shorter than its maximum value, the co-ordination control circuit 88 generates a negative polarity signal on the line 89 to turn on the LED 159 and lower the resistance of LDR 156. This provides a low resistance feedback path for shunting the LCR network and reducing the gain and slope introduced by the slope amplifier 87. When the outgoing cable length is at its maximum, the coordination control circuit 88 generates a signal to the LED 159 such that the resistance of the LDR 156 maintains the voltage at the junction 157 equal the coordination reference voltage on the line 55. In this case, the resistance of the LDR 156 is such that the gain and slope introduced by the amplifier 87 is correct for the maximum cable length.

To compensate for the non-linear slope control which is introduced in the sloped carrier group on the line 92 by the resistors 158 and 162, the AGC amplifier is provided with a means for generating output signals having a DC offset which is a non-linear function of the gain. This DC offset is controlled by the capacitor 106 and the resistors 104 and 105 which are typically selected to provide the desired response when the incoming cable is at an intermediate length.

The co-ordination control circuit 88 includes an amplifier 164 having a non-inverting input 164-2 connected to the line 55 and an inverting input 164-1 connected to the line 91. A capacitor 165 is connected between an output 164-3 and the input 164-1 while a resistor 166 is connected between the outut 164-3 and the line 89.

The coordination control circuit 88 functions to generate a coordination drive signal on the line 89 to the amplifier 87. The signal at the input 164-2 has a magnitude which represents the outgoing cable length. The amplifier 164 generates an output signal to the LED 159 through the resistor 166. A DC sense signal on the line 91 varies in magnitude in accordance with the resistance of the LDR 156. The amplifier 164 functions to control the resistance of the LDR 156 such that the voltage at the junction 157 is equal to the magnitude of the reference signal on the line 55.

Figure 7:
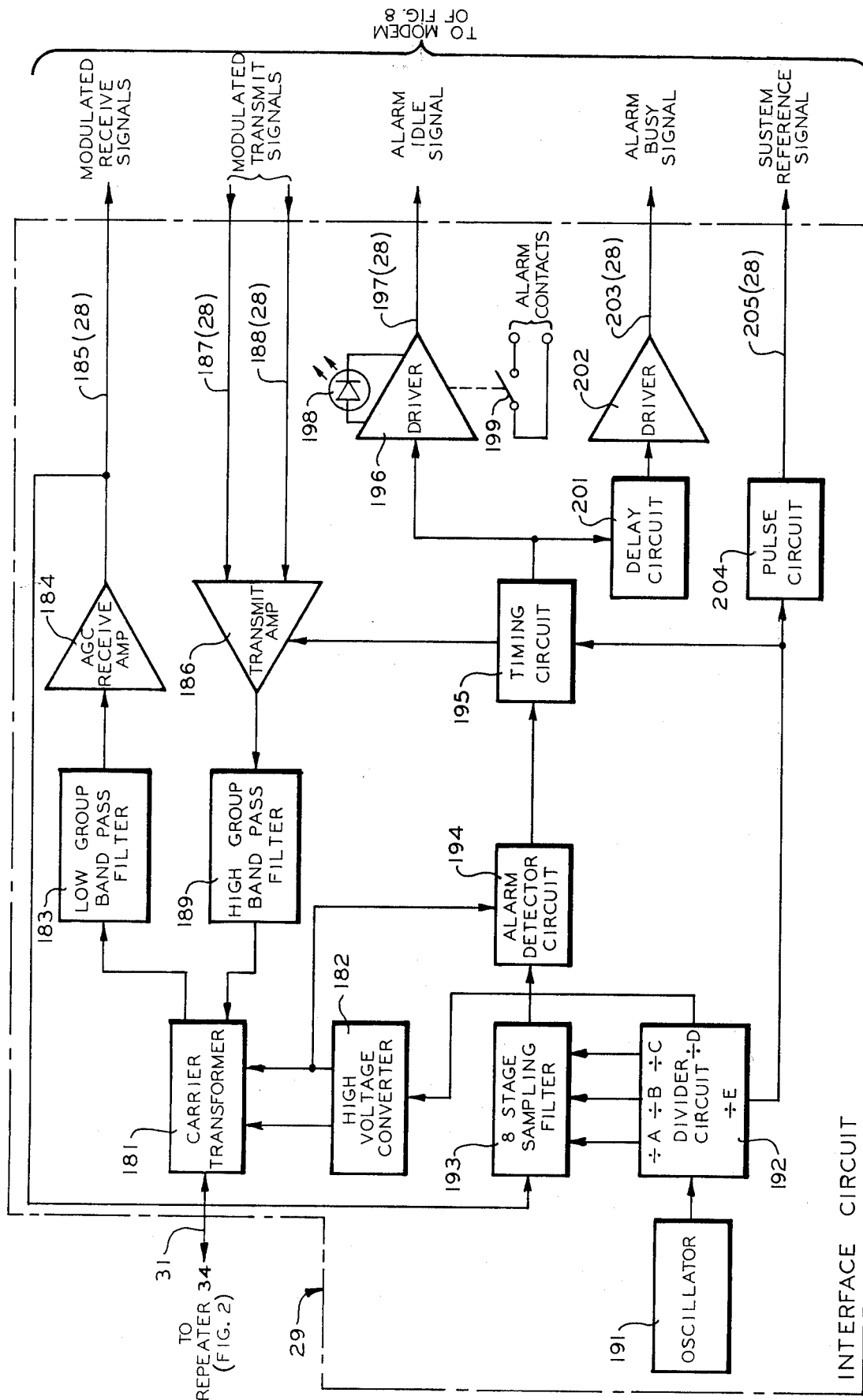
FIG. 7 is a block diagram of the interface circuit of FIG. 2.

There is shown in FIG. 7 a block diagram of the interface circuit 29 of FIG. 2. As previously mentioned, the interface circuit 29 functions to convert the various transmit and receive signals on the single cable pair line 31 into separate transmit and receive signals for the corresponding lines included in the lines 28. The interface circuit 29 provides a DC power signal on the line 31 to power the repeaters located on the trunk line 19. The circuit 29 also provides a means for indicating an alarm condition and for disabling the associated modems during a system failure.

A carrier transformer 181 receives a pair of DC voltage signals of opposite polarity on a pair of lines from a high voltage converter 182 and generates the DC power signals on the line 31. The transformer 181 isolates the high and low carrier frequencies from the DC power and supplies the carrier frequencies to a low group band pass filter 183. The filter 183 permits the low group signals to pass through to an AGC receive amplifier 184, while sufficiently attenuating signals at frequencies outside the bandpass.

The AGC receive amplifier 184 amplifies the low group signals and generates the output signals on a line 185 included in the plurality of lines 28 connected to the modems in FIG. 2. The output signals on the line 185 represent the modulated receive signals which are supplied to the modems 26. The amplifier 184 includes an automatic gain control means (not shown) for maintaining the modulated receive signals on the line 185 at a constant power level. The amplifier 184 also provides a low output impedance for driving the associated modem circuitry.

A transmit amplifier 186 receives the modulated transmit signals from the modems 26 on a pair of lines 187 and 188. The amplifier 186 generates an amplified output signal and establishes the output impedance required to drive a high group band pass filter 189 which permits the high group signals to pass through to the transformer 181, while sufficiently attenuating signals at frequencies outside the bandpass. The transformer 181 generates the high group signals from the filter 189 on the line 31, while isolating the filter 189 from the DC power signals generated by the converter 182.

The interface circuit 29 includes a crystal controlled oscillator 191 for generating a crystal reference signal to a divider circuit 192. The divider circuit 192 performs a series of division operations on the crystal reference signal to generate a plurality of frequency reference signals for controlling various circuits included in the interface circuit 29. The circuit 192 generates a ÷D reference signal to the high voltage converter 182 which utilizes this signal to convert DC power from the central office battery (not shown) into the pair of opposite polarity DC voltages required to power the associated system repeaters. Typically, the ÷D reference frequency is located intermediate the high and low carrier group frequencies to provide good switching characteristics and minimize spurious frequency signals.

The divider circuit 192 generates a group of three frequency reference signals (÷A, ÷B and ÷C) corresponding to three of the low group carriers to be sampled by an eight stage sampling filter 193. As will be discussed, the low group carrier frequencies are harmonics of a system reference signal supplied by the interface circuit to the associated modems. The filter 193 is connected to the line 185 to monitor the incoming low group carriers at the output of the AGC receive amplifier 184. The filter 193 generates a signal to an alarm detector circuit 194 which represents the combined power level of the three sampled carriers. The filter has relatively narrow passbands, for example, 20 Hz, centered at the three carrier reference signals, thus minimizing the tendency of random noise being detected as a valid carrier signal.

The alarm detector circuit 194 includes a biased detector transistor (not shown) for generating an alarm signal to a timing circuit 195 when the combined power level of the sampled carriers falls below a preselected threshold. The detector circuit 194 monitors one of the DC power signals from the converter 182 and generates an alarm signal to the timing circuit 195 when no power signal is present. In addition to monitoring selected incoming carrier signals and the DC power signal, the detector circuit can also be utilized to monitor a fuse (not shown) through which power is supplied to the modems 26.

The timing circuit 195 receives a ÷E frequency signal from the circuit 192 which is utilized for delaying the generation of an alarm condition signal to a driver 196. For example, the circuit can require the alarm signal from the detector circuit 194 to be present for two uninterrupted seconds before the alarm condition signal enables the driver 196. When the driver 196 is enabled, an alarm idle signal is generated at ground potential on a line 197 which is connected to the modems 26 for forcing all channels idle and releasing the subscribers. The driver 196 is connected to an LED 198 located on a control panel at the central office for providing a visual indication of an alarm condition. A switch 199 is responsive to a signal from the enabled driver 196 for providing a current path between a pair of alarm contacts which can be connected to an audible alarm.

A delay circuit 201 is responsive to the alarm condition signal from the timing circuit 195 and functions to delay the signal for a predetermined interval before enabling a driver 202. When enabled, the driver 202 generates an alarm busy signal at ground potential on a line 203 to the modems 26 to force all channels busy and prevent seizure of the channels by new call attempts.

The interface circuit of the trunk communication system according to the present invention includes means for signalling the far central office of an alarm condition. When an alarm condition is present, the timing circuit 195 generates a signal to the transmit amplifier 186 which alternately enables and disables the amplifier for preselected intervals, pulsing the transmit carriers on and off, to signal the far central office of an alarm condition.

The interface circuit 29 includes means for automatic restoral of the system after the alarm condition has cleared. When the alarm condition is cleared, the timing circuit 195 immediately discontinues pulsing the transmit amplifier 186. The timing circuit 195 will continue to maintain the drivers 196 and 202 in an enabled state for a predetermined time, for example, eight seconds, to ensure that the alarm condition has cleared at the far central office.

When the near office receives a continuous carrier signal for a predetermined minimum time period, for example, ten seconds, the alarm condition has cleared at the far office, and the circuit 195 generates an alarm clear signal to disable the drivers 196 and 202. It should be noted that the delay circuit 201 can be constructed to delay only the alarm condition signal from the circuit 195, while permitting the alarm clear signal to be supplied to the driver 202 without delay. If the alarm condition has not cleared at the far office, the circuit 195 will return to pulsing the transmit amplifier 186 while continuing to generate the alarm condition signal to the drivers 196 and 202.

A pulse circuit 204 receives the ÷E frequency reference signal from the divider circuit 192 and generates a fixed duration pulse train at the ÷E frequency on a line 205 to the modems 26. As will be discussed, the pulse train on the line 205 is used by the modems 26 as a system reference signal for controlling the frequencies of the transmit carriers and their respective signaling sidebands.

Figure 8:
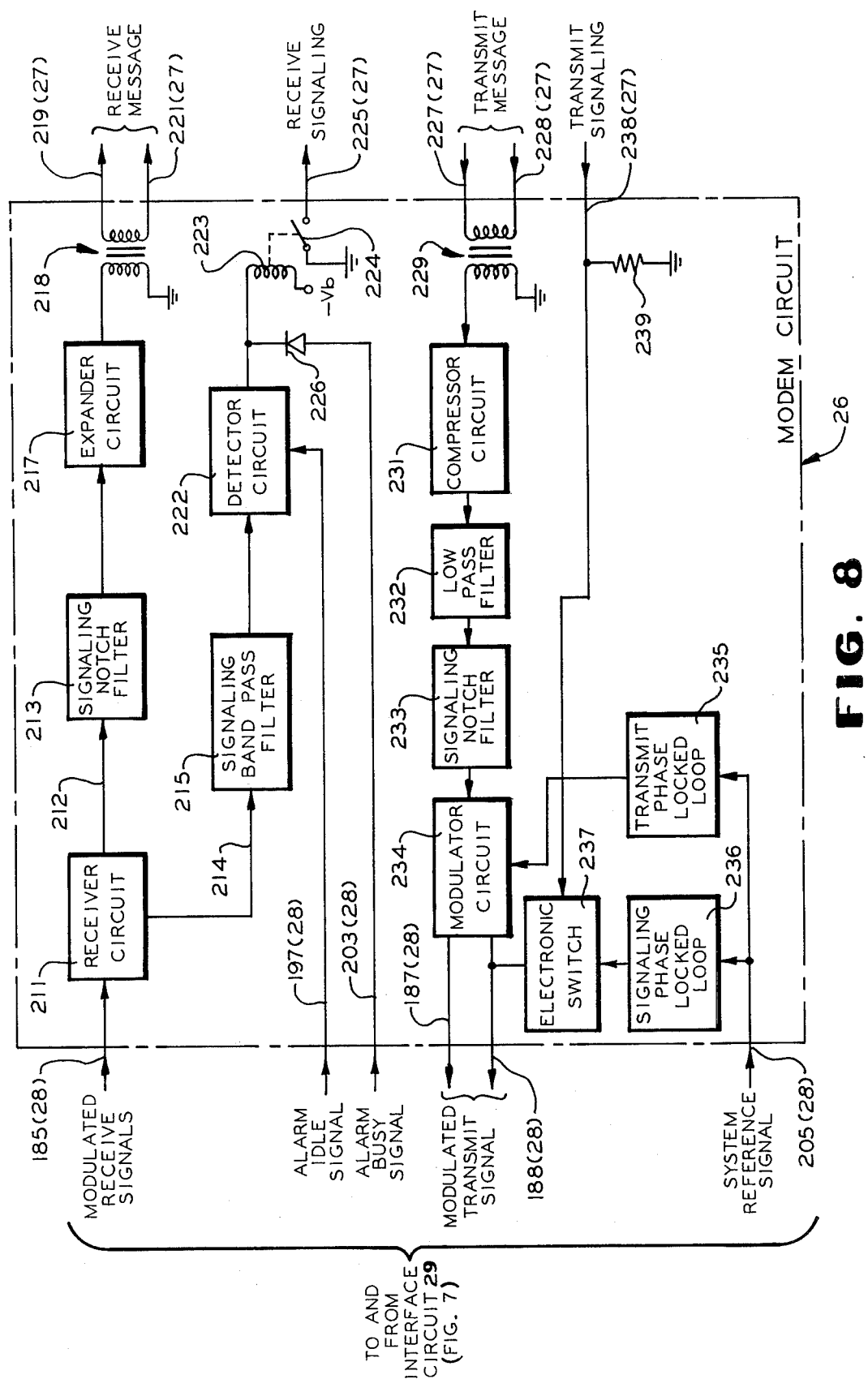
FIG. 8 is a block diagram of one of the modems of FIG. 2.

There is shown in FIG. 8 a block diagram of one of the modems 26 shown in FIG. 2. Each of the modems 26 includes a receiver circuit 211 which is tuned to receive a separate channel at a particular carrier frequency. The receiver circuit 211 demodulates the signal on the line 185 and generates a compressed receive signal on a line 212 to a signaling notch filter 213. The circuit 211 also generates a receive signaling signal on a line 214 to a signaling bandpass filter 215.

The receiver circuit 211 locks in on the selected carrier frequency to demodulate the signal on the line 185. Each channel has a bandwidth for carrying a modulated voice frequency message. Any signaling associated with a particular channel can be transmitted at a frequency outside the voice frequency bandwidth. Typically, the signaling is located on a selected one of the upper and lower carrier sidebands. For example, if the voice frequency message requires a bandwidth up to 3400 Hz, the single sideband signaling frequency can be 4000 Hz.

The signaling notch filter 213 is designed to reject all signals in a relatively narrow frequency band centered at the selected signaling frequency. The expander circuit 217 generates a receive signal having an output voltage amplitude range larger than the amplitude range of the input voltage. For example, the expander circuit 217 can generate a 2 dB change in output voltage for each 1 dB change in input voltage. The receive message is supplied to a primary winding of a transformer 218 where it is then coupled to a secondary winding connected to a pair of lines 219 and 221 included in the plurality of lines 27. The transformer 218 provides the output impedance required to drive the associated circuitry.

As will be discussed, the transmit signals are initially compressed in the transmitter portion of the modem. This process of compression and expansion, commonly known as companding, functions to improve the low level passages and minimize the noise which is introduced between the compressor and expander circuits of communicating modems.

The signaling bandpass filter 215 rejects all signals not included in a relatively narrow frequency band centered at the selected signaling frequency. The output of the filter 215 is supplied to a detector circuit 222 which is connected to one terminal of a relay coil 223 having another terminal connected to a −Vb power supply (not shown). When the magnitude of the signal from the filter 215 falls below a preselected threshold, the detector circuit 222 generates a signal near ground potential to energize the relay coil 223 which causes a normally open relay switch 224 to close and generate a ground potential signal on a line 225. When the receive signaling sideband is on, the coil 223 is de-energized to open the switch 224 and force the line 225 to the idle state.

The alarm idle signal on the line 197 is supplied to the detector circuit 222 while the alarm busy signal on the line 203 is connected to an anode of a diode 226 having a cathode connected to the relay coil 223. As previously mentioned, both the lines 197 and 203 are normally at a negative potential. This negative potential typically has a magnitude equal to or greater than the magnitude of the −Vb signal connected to the relay coil 223. When an alarm condition occurs, a ground potential signal is generated on the line 197 which causes the output of the detector to de-energize the coil 223 and force the line 225 idle. This releases any subscribers which are then utilizing this communication channel. After a certain time interval, a ground potential signal is generated on the line 203 to energize the coil 223, and force the line 225 to ground potential. A ground potential on the line 225 indicates that the channel is in its busy state.

The modem receives a transmit message at voice frequency on a pair of lines 227 and 228 which are connected to the terminals of a primary winding of a transformer 229. The transformer 229 is selected to provide the desired input impedance to the source of the transmit message. The transmit message is coupled to the secondary winding of the transformer where it is then supplied to a compressor circuit 231. The circuit 231 generates a compressed transmit signal having output voltages with an amplitude range smaller than the amplitude range of the input voltages. For example, the compressor circuit 231 can generate a 1 dB change in output voltage for each 2 dB change in input voltage. Thus, the circuit 231 functions to reduce the volume range of the transmit message. As previously discussed, the inverse of this operation is performed in the receiver portion of the respective modem.

The compressed transmit signal is supplied to a low pass filter 232 having a cutoff frequency selected to provide the desired bandwidth of the transmit signal. The output of the filter 232 is supplied to a signaling notch filter 233 designed to reject all signals in a relatively narrow frequency band centered at the selected signaling frequency, which is typically higher than the cutoff frequency of the filter 232. The notch filter 233 provides additional rejection at the signaling frequency and prevents any transmit message from interfering with the transmit signaling signal which is subsequently combined with the modulated transmit signal.

A modulator circuit 234 receives the compressed transmit signal from the filter 233 and a carrier signal from a transmit phase locked loop 235. The modulator circuit 234 typically includes an amplifier (not shown) for multiplying the transmit and carrier signals to generate a double sideband amplitude modulated (DSB-AM) transmit signal on the lines 187 and 188. As will be discussed, the transmit phase locked loop 235 includes an LC oscillator (not shown) which locks on a selected harmonic frequency of the system reference signal on the line 205.

A signaling phase locked loop 236 is utilized to generate a transmit signaling sideband which is supplied through an electronic switch 237 and then added to the modulated transmit signal on the line 188. The phase locked loop 236 is similar to the transmit phase locked loop 235 and locks on a harmonic frequency of the system reference signal which is typically one harmonic below the carrier signal generated by the circuit 235. Thus, the transmit signaling signal is transmitted on the lower sideband of the modulated transmit signal at a frequency below the carrier frequency by an amount equal to the frequency of the system reference signal.

The transmit signaling is switched in and out of the modulated transmit signal by the electronic switch 237 which receives a transmit signaling control signal on a line 238. The switch 237 can be a diode switch (not shown) which closes to connect the output of the phase locked loop to the line 188 when the signal on the line 238 is at ground potential. The diode switch can open when the signal on the line 238 is at a predetermined negative potential. A resistor 239 is connected between the line 238 and the ground potential to maintain the switch 237 in the closed state when there is no signal on the line 238.

Each of the modems are designed to transmit at a selected one of a high frequency group of signals and to receive a selected one of a low frequency group of carrier frequencies. For example, the following Table of Modem Frequencies illustrates typical transmit and receive frequencies for the seven modems associated with each central office shown in FIG. 2.

| Modem | Table of Modem Frequencies | |
|---|---|---|
| | Transmit | Receive |
| One | 144 kHz | 8 kHz |
| Two | 136 kHz | 16 kHz |
| Three | 128 kHz | 24 kHz |
| Four | 120 kHz | 32 kHz |
| Five | 112 kHz | 40 kHz |
| Six | 104 kHz | 48 kHz |
| Seven | 96 kHz | 56 kHz |

As previously mentioned, the frogging repeater includes a mixer which subtracts the transmitted high group signals from the mixer reference signal to obtain the received low group signals. Thus, if the modems are designed in accordance with the above frequencies, the mixer reference signal generated by the frogging repeater must be 152 kHz. For example, 152 kHz−144 kHz=8 kHz.

The high group frequencies are each equal to a separate harmonic frequency of the system reference signal. This permits accurate frequency control of the transmitted carrier, while requiring only a single crystal to control all seven modems. The adjacent carrier frequencies are separated by exactly two harmonics, and the lower sideband is typically used for transmit signaling.

However, this introduces a problem with respect to signaling. Since the transmit signaling is transmitted at a frequency one harmonic below the associated carrier frequency, it will be located midway between two carrier frequencies. Thus, when transmitted, the signaling associated with a particular carrier frequency is present on the lower sideband of that carrier frequency and on the upper sideband of the next lower carrier frequency. However, when the signals are received, the signaling associated with a particular carrier frequency will be received on the upper sideband. This is caused by the frequency frogging portion of the repeater 36 in which the mixer transforms the upper and lower sidebands of each carrier frequency.

After the respective carrier channels have passed through the frogging repeater 36, the signaling associated with a particular carrier frequency is located on its upper sideband, while, for channels two through seven, the lower sideband contains the signaling associated with the next lower carrier. For channel one, there is no signaling present on its lower sideband. The receiver circuit of the modems for channels two through seven must be capable of rejecting this lower sideband signaling while sufficiently receiving the receive message and the upper sideband signaling. Thus, only channels two through seven must reject the lower sideband signaling. However, if the channel one carrier frequency is sufficiently low, the receiver circuit of the channel one modem may require several features not needed in the channels two through seven modems. The channel one modem receiver circuit will be discussed subsequent to the discussion of the channels two through seven receiver circuit.

Figure 9:
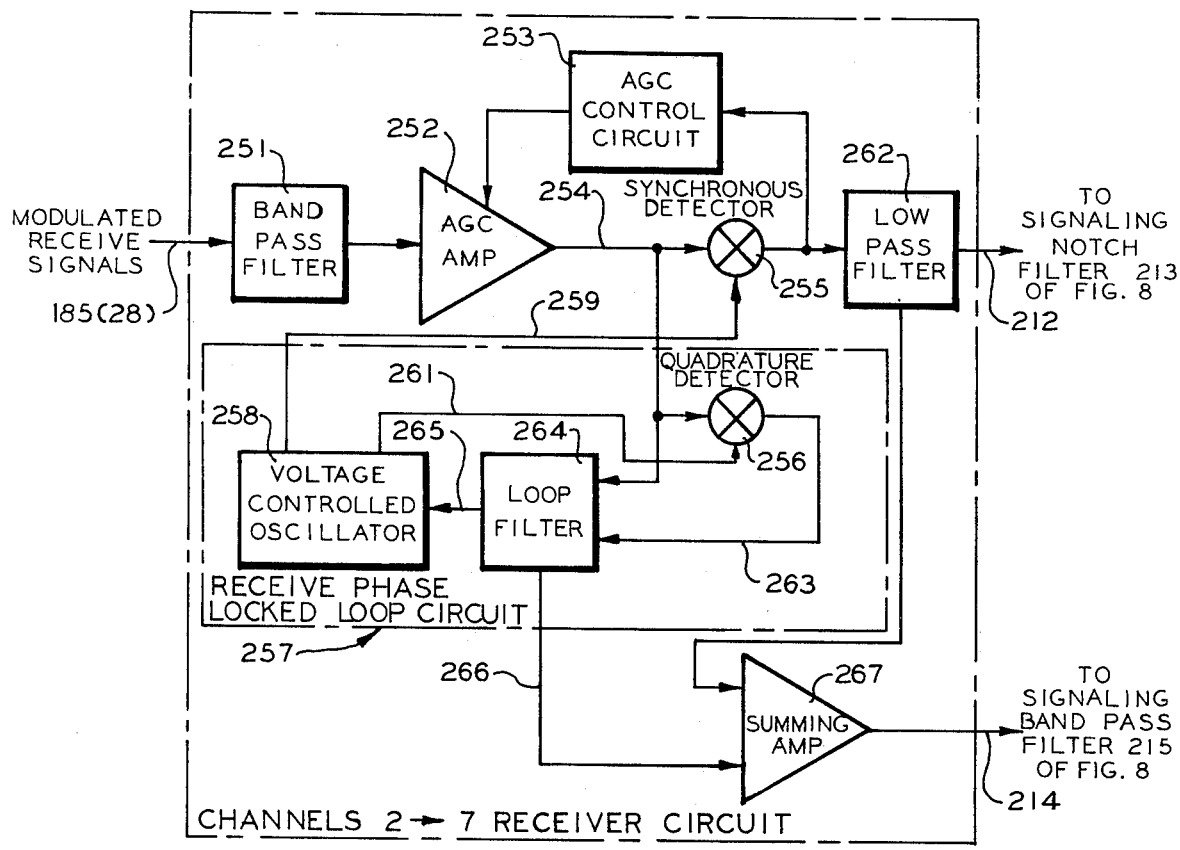
FIG. 9 is a block diagram of the channel two through seven receiver circuits of FIG. 8.

There is shown in FIG. 9 a block diagram of the receiver circuit used in modems two through seven. A bandpass filter 251 receives the modulated receive signals on the line 185. The filter 251 has a bandpass centered at the carrier frequency of the respective channel and sufficiently rejects signals which are outside the upper and lower sidebands of the particular carrier. The output of the filter 251 is applied to an AGC amplifier 252 which receives a control signal from an AGC control circuit 253. The amplifier 252 generates an output signal on a line 254 to a synchronous detector 255 and to a quadrature detector 256 included in a receive phase locked loop circuit 257.

The phase locked loop circuit 257 includes a voltage controlled oscillator 258 which locks in frequency with the signal on the line 254 to generate an unmodulated signal on a line 259 to the detector 255. The oscillator 258 also generates a signal to the detector 256 on a line 261 which is phase shifted 90° with respect to the signal on the line 259.

Both the synchronous detector 255 and the quadrature detector 256 generate an output signal equal to the product of the two respective input signals. As will be discussed, the oscillator signal on the line 259 is 180° out of phase with the received carrier signal on the line 254. The output of the detector 255 supplies a feedback signal to the AGC control circuit 253 and the demodulated sideband signals to a low pass filter 262. The cutoff frequency of the filter 262 is typically below the signaling frequency. The filter 262 generates the receive message at voice frequency on the line 212 to the signaling notch filter 213. The output of the detector 255 is also supplied to the AGC control circuit 253 to control the gain of the amplifier 252.

The output of the detector 256 includes the demodulated upper and lower sidebands which are phase shifted 90° with respect the output of the detector 255. The detector generates an output signal on a line 263 to a loop filter 264. The loop filter is also connected to receive the output of the AGC amplifier 252 and utilizes this signal in conjunction with the output of the detector 256 to generate an error signal on a line 265 to the oscillator 258. This error signal maintains the frequency of the oscillator 258 locked onto the received carrier frequency.

The loop filter 264 includes means for phase shifting the signal on the line 263 and supplying this signal on a line 266 to one input of a summing amplifier 267. The other input of the summing amplifier 267 is connected the low pass filter 262 which also introduces a phase shift in the output signal out of the detector 255. The filters 262 and 264 introduce a composite phase shift in the two detector output signals such that the upper sideband signals are in phase when supplied to the summing amplifier. Since the phase difference between the two detector outputs is typically 90°, the filters 262 and 264 typically introduce a −90° phase shift. As will be discussed, the upper sideband signals from the filter 262 and the filter 264 are in phase while the lower sideband signals are 180° out of phase. Hence, the two upper sideband signals are added by the summing amplifier 267, while the lower sideband signals are cancelled. The upper sideband signal is generated on the line 214 to the signaling bandpass filter 215.

Figure 10:
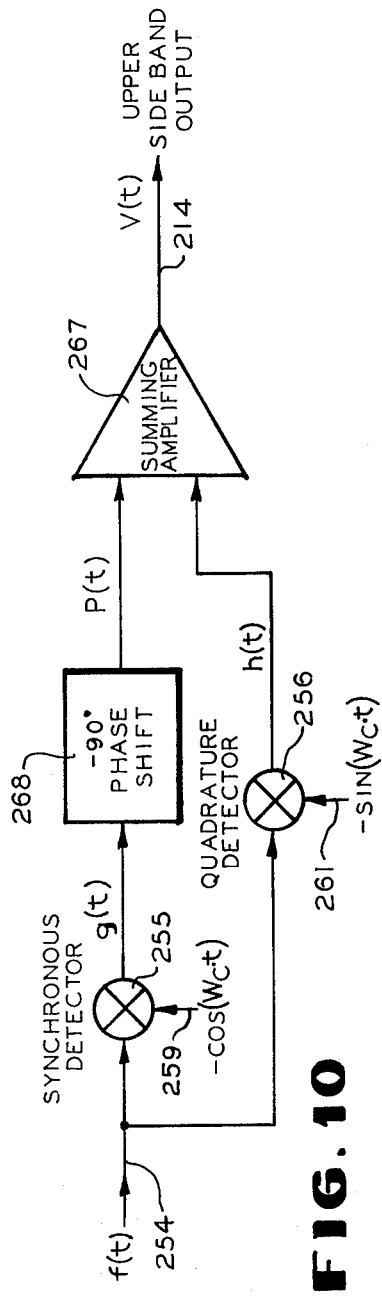
FIG. 10 is a block diagram of a portion of the receiver circuit of FIG. 9.

There is shown in FIG. 10 a block diagram of a portion of the receiver circuit of FIG. 9 which will be utilized to more fully described the apparatus and method of phase concellation of the lower sideband signal. The composite −90° phase shift introduced by the filters 262 and 264 in FIG. 9 is represented by a −90° phase shift block 268. The detector 255 receives the modulated receive signal which can be represented by the following equation:

$$f(t) = \cos(Wc \cdot t) + \frac{A}{2} \cdot \cos(Wc \cdot t + Wm \cdot t) + \frac{B}{2} \cdot \cos(Wc \cdot t - Wm \cdot t).$$

In the above equation,
t = time,
Wc = angular frequency of the carrier signal.
Wm = angular frequency of the modulating signal,
cos (Wc·t) = carrier signal,
A/2·cos (Wc·t+Wm·t) = upper sideband signal, and
B/2·cos (Wc·t−Wm·t) = lower sideband signal.

The synchronous detector 255 receives a −cos (Wc·t) signal and the quadrature detector 256 receives a −sin (Wc·t) signal from the voltage controlled oscillator 258 (not shown in FIG. 10). The signal out of the synchronous detector 255 can be represented by the following equation:

$$g(t) = f(t) \cdot -\cos(Wc \cdot t) = -\tfrac{1}{2} - \frac{A}{4} \cdot \cos(-Wm \cdot t)$$
$$- \frac{B}{4} \cdot \cos(Wm \cdot t) \cdot$$

Since cos (−Wm · t) = cos (Wm · t),
$$g(t) = -\tfrac{1}{2} - \frac{A+B}{4} \cdot \cos(Wm \cdot t).$$

The signal out of the quadrature detector 256 can be represented by the following equation:

$$h(t) = f(t) \cdot -\sin(Wc \cdot t) = -\frac{A}{4} \cdot \sin(-Wm \cdot t)$$
$$- \frac{B}{4} \cdot \sin(Wm \cdot t).$$

Since sin (−Wm · t) = −sin (Wm · t),

-continued $$h(t) = \frac{A-B}{4} \cdot \sin(Wm \cdot t).$$

The −90° phase shift block 268 results in $$p(t) = \frac{A+B}{4} \cdot \sin(Wm \cdot t).$$

The output of the summing amplifier 267 is $$h(t) + p(t) = \left(\frac{A-B}{4} + \frac{A+B}{4}\right) \cdot \sin(Wm \cdot t) = \frac{A}{2} \cdot \sin(Wm \cdot t).$$

Thus, it can be seen that the lower sideband signal B has been cancelled and that only the upper sideband signal A is present on the line 214.

Figure 11:
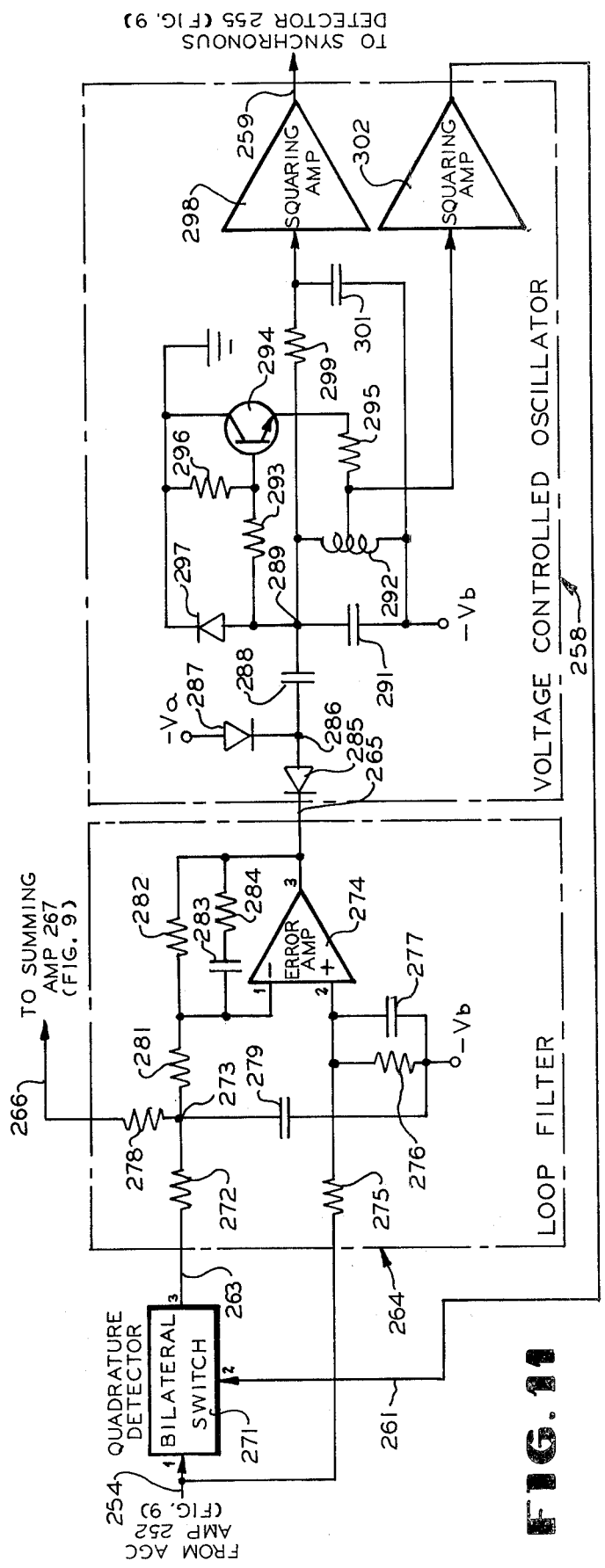
FIG. 11 is a block diagram of the receiver phase locked loop circuit of FIG. 9.

There is shown in FIG. 11 a more detailed block diagram of the receive phase locked loop circuit 257 of FIG. 9. The quadrature detector is represented as a bilateral analog switch 271 which can be a CD 4016A COS/MOS bilateral switch manufactured by RCA. The switch 271 has a signal input terminal 271-1 connected to the line 254 and a control input terminal 271-2 connected to the line 261. A signal output terminal is connected to a common junction 273 through a resistor 272.

The line 254 is also connected to a non-inverting input of an error amplifier 274 through a resistor 275. A resistor 276 and a capacitor 277 are connected in parallel between the non-inverting input 274-2 and a −Vb power supply (not shown).

The signal at the junction 273 is applied to the line 266 through a resistor 278. A capacitor 279 is connected between the junction 273 and the −Vb power supply. A resistor 281 is connected between the junction 273 and an inverting input 274-1. A resistor 282 is connected between the input 274-1 and an output 274-3 connected to the line 265. A capacitor 283 and a resistor 284 are connected in series between the input 274-1 and the output 274-3.

As previously mentioned, the oscillator 258 generates a signal on the line 261 which locks in frequency but is phase shifted −90° with respect to the carrier signal on the line 254. The switch 271 demodulates the signal on the line 254 and generates the demodulated signal on the line 263. The signal on the line 261 is phase shifted −90° with respect to the carrier signal on the line 254. This results in the demodulated signal on the line 263 being phase shifted +90° with respect to the modulated signal on the line 254. The signal on the line 263 is then phase shifted by the resistors 272 and 278 and the capacitor 279 before being applied to the summing amplifier 267. The amount of phase shift introduced by the filter 264 is set such that the upper sideband signal on the line 266 is in phase with the upper sideband signal to the other input of the summing amplifier 267.

The filtered signal at the junction 273 is applied to the inverting input of the error amplifier 274. The amplifier 274 generates an error voltage on the line 265 which controls the frequency of the oscillator 258. The resistors 275 and 276 and the capacitor 277 function as a low pass filter to bias the input 274-2 at the average DC voltage of the signal on the line 254. This prevents latch-up of the error amplifier 274 if the AGC amplifier becomes overloaded.

The resistor 281, the capacitor 283 and the resistor 284 are connected to the amplifier 274 in a manner such that the amplifier 274 generates an output voltage on the line 265 which is proportional to the error in the frequency of the oscillator 258. The resistor 282 provides a DC feedback signal to the input 274-1 to stabilize the operating point and prevent saturation of the amplifier 274.

The values of the components associated with amplifier 274 are typically chosen such that, when the frequency of the signal on the line 261 is equal to the carrier frequency on the line 254, the amplifier generates an output voltage near the −Vb potential. When the carrier frequency on the line 254 becomes greater than the frequency of the signal on the line 261, the amplifier decreases the magnitude of the negative potential signal on the line 265. As will be discussed, this causes the oscillator to increase its output frequency such that it becomes equal to the carrier frequency. If the carrier frequency is lower than the oscillator frequency, the amplifier 274 increases the magnitude of the negative potential signal on the line 265. This causes the oscillator frequency to decrease such that it becomes equal to the carrier frequency.

The voltage controlled oscillator 258 includes a diode 285 having an anode connected to a common junction 286 and a cathode connected to the line 265. A clamping diode 287 has an anode connected to a −Va power supply (not shown) and a cathode connected to the junction 286. As will be discussed, the −Va potential is typically equal to twice the −Vb potential.

A capacitor 288 is connected between the junction 286 and a common junction 289. A capacitor 291 and an inductor 292 are connected in parallel between the junction 289 and the −Vb power supply. A resistor 293 is connected between the junction 289 and a base of an NPN transistor 294 having a collector connected to the ground potential and an emitter connected to a tap of the inductor 292 through a resistor 295. A resistor 296 is connected between the base of the transistor 294 and the circuit ground potential. A clamping diode 297 has an anode connected to the junction 289 and a cathode connected to the circuit ground potential.

The signal at the junction 289 is applied to the input of a squaring amplifier 298 through a resistor 299. The output of the amplifier 298 is connected to the line 259. A capacitor 301 is connected between the input of the amplifier 298 and the −Vb power supply. A squaring amplifier 302 has an input connected to the tap of the inductor 292 and an output connected to the line 261.

The capacitor 291, the inductor 292, the transistor 294, and biasing resistors 293 and 296 form an LC oscillator which is voltage controlled by the signal on the line 265. The voltage on the line 265 functions to control the oscillator frequency by switching the capacitor 288 in and out of a tank circuit which comprises the capacitor 291 and the inductor 292.

The oscillator frequency is determined by the values of the inductor 292 and the capacitors 288 and 291 and the amount of each cycle during which the capacitor 288 is switched in the tank circuit. The signal at the junction 289 is a sinusoidal waveform having a peak-to-peak voltage swing equal to twice the −Vb potential. Specifically, the signal at the junction 289 alternates between the circuit ground potential and twice the −Vb potential. The clamping diode 297 maintains the junction 289 below the circuit ground potential. The −Va potential is typically selected to equal twice the −Vb potential. The clamping diode 287 functions to maintain the junction 286 above the −Va potential.

As previously mentioned, the error voltage on the line 265 is typically near the −Vb potential when the carrier signal is at the desired frequency. In this case, the capacitor 288 is switched in the tank circuit for approximately one half of the oscillator cycle. The average DC potential at the junction 286 is midway between the −Va potential and the potential of the error voltage on the line 265. The diode 285 conducts when the potential at the junction 286 is positive with respect to the potential of the error voltage on the line 265, while the diode 287 conducts when the potential at the junction 286 is less than the −Va potential. The capacitor 288 is switched in the tank circuit when either the diode 285 or the diode 287 is conductive.

When the carrier frequency falls below the oscillator frequency, the oscillator frequency must decrease to stay locked in with the carrier frequency. Since the frequency of an LC oscillator is determined by the equation $$f = \frac{1}{2\pi \sqrt{LC}}$$

it can be seen that increasing the capacitance will result in a decrease in the oscillator frequency. The capacitance of the LC oscillator is increased by switching the capacitor 288 into the tank circuit for a larger portion of the oscillator cycle. When the carrier frequency falls below the oscillator frequency, the amplifier 274 increases the magnitude of the negative polarity signal on the line 265. This permits the diodes 285 and 287 to be conductive for a larger portion of the oscillator cycle. Thus, the capacitor 288 is switched in the tank circuit for a longer period of time to decrease the oscillator frequency such that it equals the carrier frequency.

When the carrier frequency is greater than the oscillator frequency, the oscillator frequency must be increased by decreasing the portion of the oscillator cycle during which the capacitor 288 is switched in. In this case, the amplifier 274 decreases the magnitude of the negative polarity signal on the line 265. The portion of the oscillator cycle during which the diodes 285 and 287 are conductive is decreased and this in turn increases the oscillator frequency.

The signal at the junction 289 is phase shifted 90° by the resistor 299 and the capacitor 301 before being applied to the squaring amplifier 298. The amplifier 298 transforms the sinusoidal wave form at its input into a square waveform signal which is supplied to the synchronous detector 255 on the line 259. The square waveform presents a more suitable waveform for detection by the detector 255.

The squaring amplifier 302 receives a sinusoidal waveform from the tap of the inductor 292 and generates a square waveform on the line 261 to the switch 271. The sinusoidal waveform at the tap of the inductor 292 is identical in frequency but reduced in amplitude with respect to the signal at the junction 289.

Figure 12:
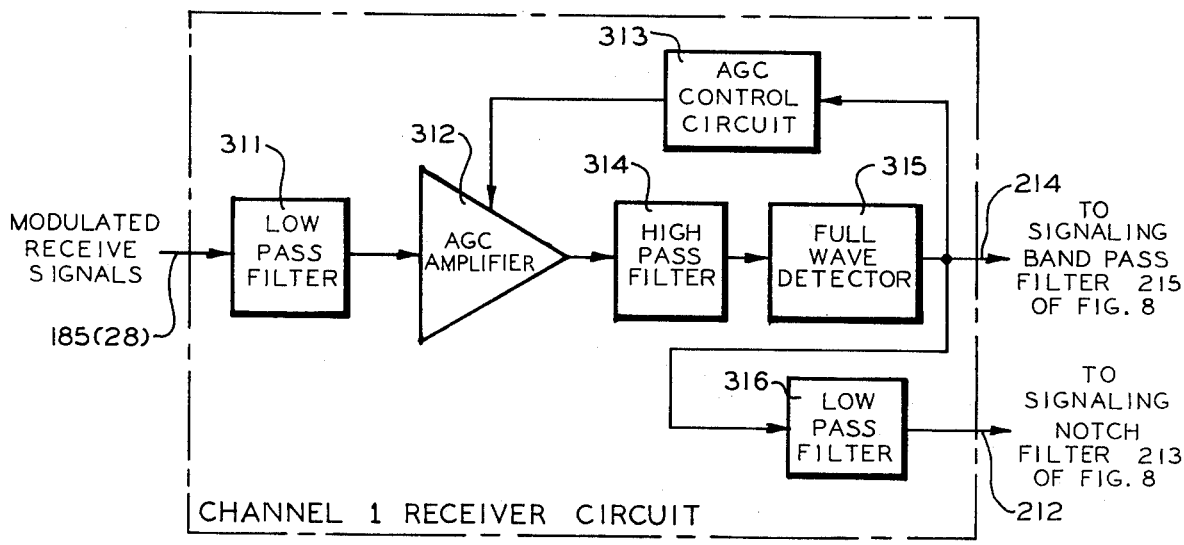
FIG. 12 is a block diagram of the channel one receiver circuit of FIG. 8.

There is shown in FIG. 12 a block diagram of the receiver circuit which is utilized for channel one. As previously mentioned, there is no lower sideband signaling present on channel one and therefore the receiver circuit does not require circuitry for the cancellation of the lower sideband. However, if the degree of modulation is relatively high with respect to the carrier frequency, means must be provided to sufficiently separate the carrier signal from the modulating waveform. For example, 3.4 kHz of modulation on an 8 kHz carrier signal typically requires complex filtering for separating the modulating waveform.

A low pass filter 311 is designed to supply an AGC amplifier with the channel one signal, while sufficiently attenuating all other channels. It should be noted that the filter 311 can be utilized to introduce a predetermined phase shift in the channel one signal to compensate for any phase shift introduced by the cable and repeaters on the trunk line 19.

An amplifier 312 receives a control signal from an AGC control circuit 313 which maintains the DC signal on the line 314 at a constant power level. The output of the amplifier 312 is supplied to a high pass filter 314. The filter 314 attenuates signals below the channel one carrier and generates an output signal to a full wave detector 315. The detector 315 functions as an absolute value circuit to detect the channel one carrier signal. The full wave detector 315 doubles the channel one carrier component so that the filtering requirements for separating the voice frequency message are reduced.

The detector output is generated on the line 214 to a low pass filter 316. The filter 316 functions as a demodulation filter to generate the compressed receive message on the line 212 to the signaling notch filter 213. The line 214 is also connected to the signaling bandpass filter 215 which in turn receives any signaling present on the upper sideband of channel one.

In summary, the present invention concerns a receiver in a communications system for transmitting and receiving information signals modulated on a carrier signal. For example, the receiver can be utilized to demodulate the voice information signals in a telephone system. The receiver includes means for generating an error signal having a magnitude representing the difference in frequency between the carrier signal and a first reference signal; means responsive to the error signal for generating the first and a second reference signal at the carrier signal frequency; and means responsive to the carrier signal and the second reference signal for demodulating the information signals from the carrier signal. The means for generating the reference signals can include means having an electrical parameter; means for generating the first and second reference signals at a frequency related to the portion of each cycle of the reference signals during which the electrical parameter means is connected to the reference signals generating means; and means responsive to the error signal for connecting the electrical parameter means to the reference signals generating means for the portion of each cycle of the reference signals related to the magnitude of the error signal. The first and second reference signals can be minus ninety degrees and one hundred eighty degrees out of phase respectively with the carrier signal, the electrical parameter means can be a capacitor and the reference signals generating means can be an inductor-capacitor oscillator.

In accordance with the provisions of the patent statutes, the principle and mode of operation of the invention have been explained and illustrated in its preferred embodiment. However, it must be understood that the invention can be practiced otherwise than as specifically illustrated and described without departing from its spirit or scope.

What is claimed is:

1. A voltage controlled oscillator for use in demodulating a carrier signal said voltage controlled oscillator generating at least one reference signal in response to an error signal having a magnitude representing the difference in phase between said carrier signal and said at least one reference signal said voltage controlled oscillator comprising:
   (a) frequency generating means for generating said at least one reference signal at a frequency equal to said carrier signal; and
   (b) means responsive to the magnitude of said error signal for variably connecting a frequency determining electrical parameter means to said frequency generating means to thereby determine the frequency of said reference signal.

2. The voltage controlled oscillator of claim 1 wherein said means responsive to said error signal includes means for varying the portion of each cycle of said reference signal that said electrical parameter means is connected to said frequency generating means.

3. The voltage controlled oscillator of claim 2 wherein said means responsive to said error signal further includes means for connecting said electrical parameter means to said frequency generating means for the portion of each cycle of said reference signal related to the magnitude of said error signal.

4. The voltage controlled oscillator of claim 3 wherein said electrical parameter means is a capacitor and said frequency generating means is an inductor-capacitor oscillator.

5. The voltage controlled oscillator of claims 3 or 4 wherein said frequency generating means generates first and second reference signals each having a frequency equal to said carrier signal and wherein said error signal magnitude represents the difference in phase between said carrier signal and said first reference signal.

6. The voltage controlled oscillator of claim 5 wherein said first reference signal is minus ninety degrees out of phase with respect to said carrier signal.

7. The voltage controlled oscillator of claim 6 wherein said second reference signal is one hundred eighty degrees out of phase with said carrier signal.

8. A voltage controlled oscillator for use in demodulating a carrier signal said voltage controlled oscillator generating at least one reference signal in response to an error signal having a magnitude representing the difference in phase between said carrier signal and said reference signal said voltage controlled oscillator comprising:
   (a) frequency generating means for generating said at least one reference signal at a frequency equal to the frequency of said carrier signal; and
   (b) means responsive to said error signal for varying the portion of each cycle of said reference signal that a frequency determining element is switched into said frequency generating means to thereby maintain the frequency of said reference signal equal to the frequency of said carrier signal.

9. The voltage controlled oscillator of claim 8 wherein said means responsive to said error signal includes means for connecting said frequency determining element to said frequency generating means for the portion of each cycle for said reference signal related to the magnitude of said error signal.

10. The voltage controlled oscillator of claims 8 or 9 wherein said frequency generating means is an inductor-capacitor oscillator and said frequency determining element is a capacitor.

11. A voltage controlled oscillator for use in demodulating an amplitude modulated carrier signal said voltage controlled oscillator generating first and second reference signals in response to an error signal having a magnitude representing the difference in phase between said carrier signal and said first reference signal said voltage controlled oscillator comprising:
   (a) frequency generating means for generating said first and second reference signals at a frequency equal to the frequency of said carrier signal; and
   (b) means responsive to the magnitude of said error signal for variably connecting a frequency determining electrical parameter means to said frequency generating means to thereby determine the frequency of said reference signals.

12. The voltage controlled oscillator of claim 11 wherein said means responsive to said error signal includes means for varying the portion of each cycle of said reference signal that said electrical parameter means is connected to said frequency generating means.

13. The voltage controlled oscillator of claim 12 wherein said means responsive to said error signal further includes means for connecting said electrical parameter means to said frequency generating means for the portion of each cycle of said reference signal related to the magnitude of said error signal.

14. The voltage controlled oscillator of claims 11, 12 or 13 wherein said electrical parameter means is a capacitor and said frequency generating means is an inductor-capacitor oscillator.

15. The voltage controlled oscillator of claim 11 wherein said first reference signal is minus ninety degrees out of phase with respect to said carrier signal and said second reference signal is one hundred eighty degrees out of phase with said carrier signal.

* * * * *